(12) United States Patent
Kawasaki et al.

(10) Patent No.: US 7,718,930 B2
(45) Date of Patent: May 18, 2010

(54) LOADING TABLE AND HEAT TREATING APPARATUS HAVING THE LOADING TABLE

(75) Inventors: Hiroo Kawasaki, Nirasaki (JP); Teruo Iwata, Nirasaki (JP); Manabu Amikura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1242 days.

(21) Appl. No.: 10/552,267

(22) PCT Filed: Apr. 7, 2004

(86) PCT No.: PCT/JP2004/005036

§ 371 (c)(1),
(2), (4) Date: Oct. 6, 2005

(87) PCT Pub. No.: WO2004/090960

PCT Pub. Date: Oct. 21, 2004

(65) Prior Publication Data

US 2006/0199131 A1 Sep. 7, 2006

(30) Foreign Application Priority Data

Apr. 7, 2003 (JP) ............................. 2003-103458
May 7, 2003 (JP) ............................. 2003-129249

(51) Int. Cl.
*H05B 3/28* (2006.01)
*F27B 5/14* (2006.01)

(52) U.S. Cl. .................... 219/444.1; 219/390; 219/521; 219/548; 392/418; 118/728

(58) Field of Classification Search .................. None
See application file for complete search history.

(56) References Cited

U.S. PATENT DOCUMENTS 5,429,498 A 7/1995 Okase et al.
5,462,603 A 10/1995 Murakami
5,662,469 A 9/1997 Okase et al.
5,680,502 A * 10/1997 Kim ............................ 392/416
5,958,140 A 9/1999 Arami et al.

(Continued)

FOREIGN PATENT DOCUMENTS

EP 1 187 187 3/2002

(Continued)

OTHER PUBLICATIONS

Notification of Transmittal of Translation of the International Preliminary Report on Patentability (Form PCT/IB/338)—PCT/JP2004/005036, dated Jan. 2004.
PCT International Preliminary Report on Patentability (Form PCT/IB/409)—PCT/JP2004/005036, dated Jan. 2004.

(Continued)

*Primary Examiner*—Joseph M Pelham
(74) *Attorney, Agent, or Firm*—Smith, Gambrell & Russell, LLP

(57) ABSTRACT

A thermal processing system has a processing vessel 4, a support post 30 stood on the bottom wall of the processing vessel 4, and a support table 32 internally provided with a heating means 38 and supported on the support post 30. A workpiece W is placed on the upper surface of the support table 32 and is subjected to a predetermined thermal process. The upper, the side and the lower surface of the support table 32 are covered with heat-resistant covering members 72, 74 and 76 to prevent the thermal diffusion of metal atoms causative of contamination from the support table 32. thus, various types of contamination, such as metal and organic contamination, can be prevented.

20 Claims, 13 Drawing Sheets

U.S. PATENT DOCUMENTS

| | | | |
|---|---|---|---|
| 6,002,109 A * | 12/1999 | Johnsgard et al. ........... 219/390 |
| 6,046,439 A | 4/2000 | Johnsgard et al. |
| 6,080,965 A | 6/2000 | Osawa |
| 6,106,630 A * | 8/2000 | Frankel ................ 118/728 |
| 6,129,046 A * | 10/2000 | Mizuno et al. .............. 118/725 |
| 6,172,337 B1 * | 1/2001 | Johnsgard et al. ........... 219/390 |
| 6,204,484 B1 | 3/2001 | Tay et al. |
| 6,342,691 B1 | 1/2002 | Johnsgard et al. |
| 6,515,264 B2 * | 2/2003 | Toya et al. ................. 118/725 |
| 6,530,994 B1 | 3/2003 | Mahawili |
| 6,733,593 B1 * | 5/2004 | Tanaka et al. ............... 118/725 |
| 6,859,616 B2 * | 2/2005 | Kusuda et al. .............. 392/416 |
| 2002/0023914 A1 * | 2/2002 | Kitagawa et al. ......... 219/444.1 |
| 2002/0096117 A1 | 7/2002 | Futamura et al. |

FOREIGN PATENT DOCUMENTS

| | | |
|---|---|---|
| JP | 2-67642 | 5/1990 |
| JP | 3-220718 | 9/1991 |
| JP | 4-120722 | 4/1992 |
| JP | 5-267309 | 10/1993 |
| JP | 5-299369 | 11/1993 |
| JP | 6-260430 | 9/1994 |
| JP | 7-078766 | 3/1995 |
| JP | 9-45624 | 2/1997 |
| JP | 9-186112 | 7/1997 |
| JP | 63-278322 | 11/1998 |
| JP | 2000173750 A * | 6/2000 |
| JP | 2000-349028 | 12/2000 |
| JP | 2001-313155 | 11/2001 |
| JP | 2002-184844 | 6/2002 |
| WO | WO 99/49501 | 9/1999 |

OTHER PUBLICATIONS

Japanese Office Action issued on Aug. 26, 2008 with partial English translation.

European Office Action issued Aug. 17, 2009 for European Application No. 04726281.1.

* cited by examiner

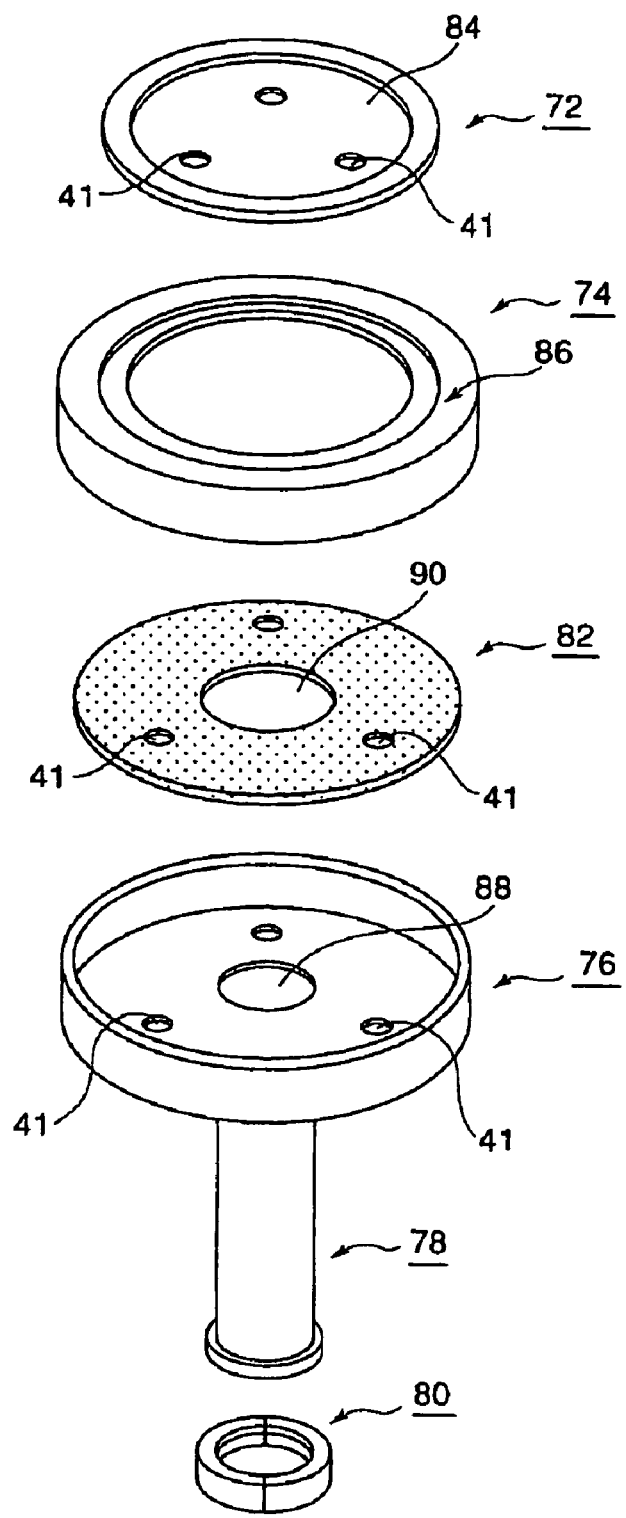
F I G. 3

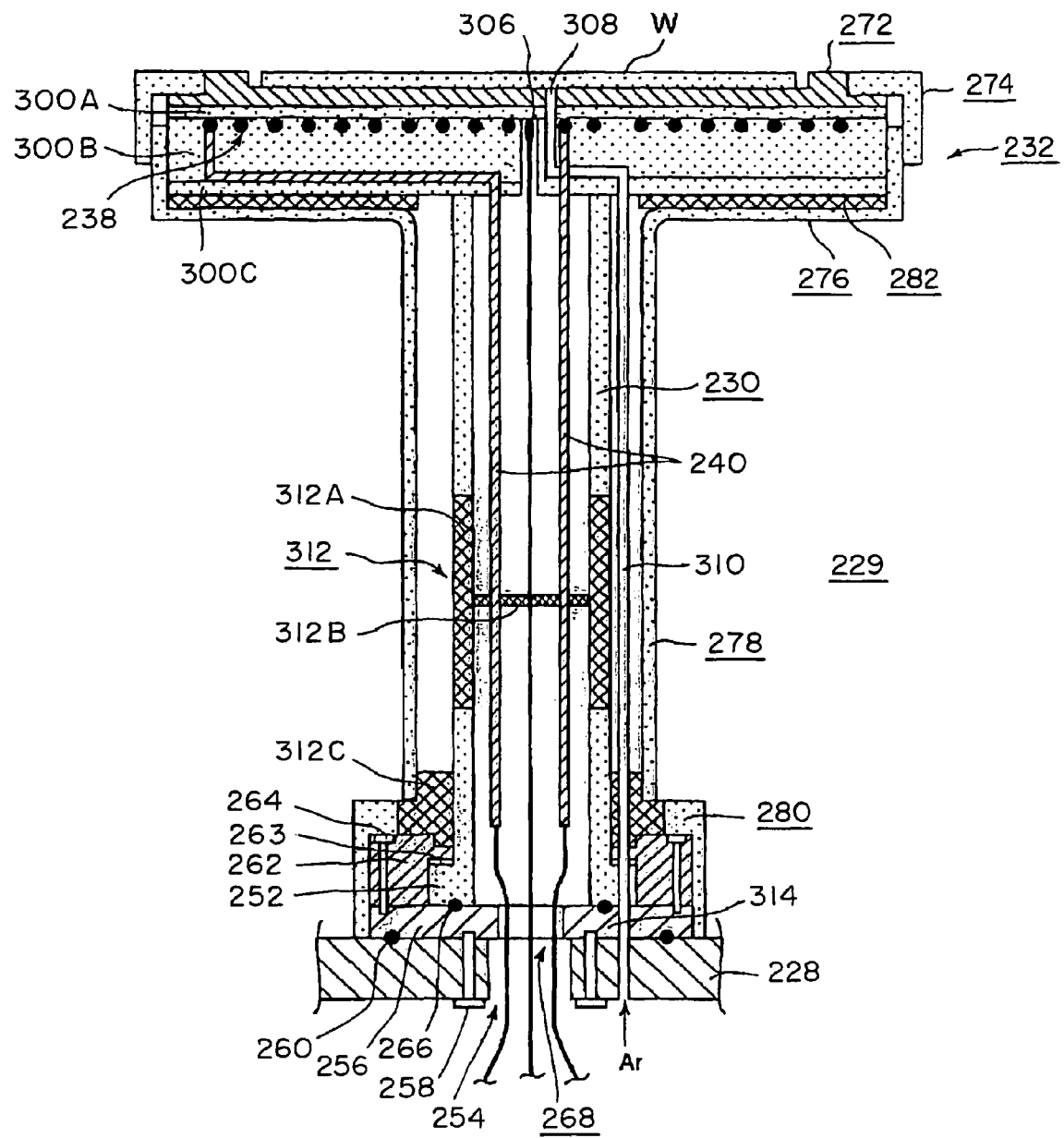
F I G. 4

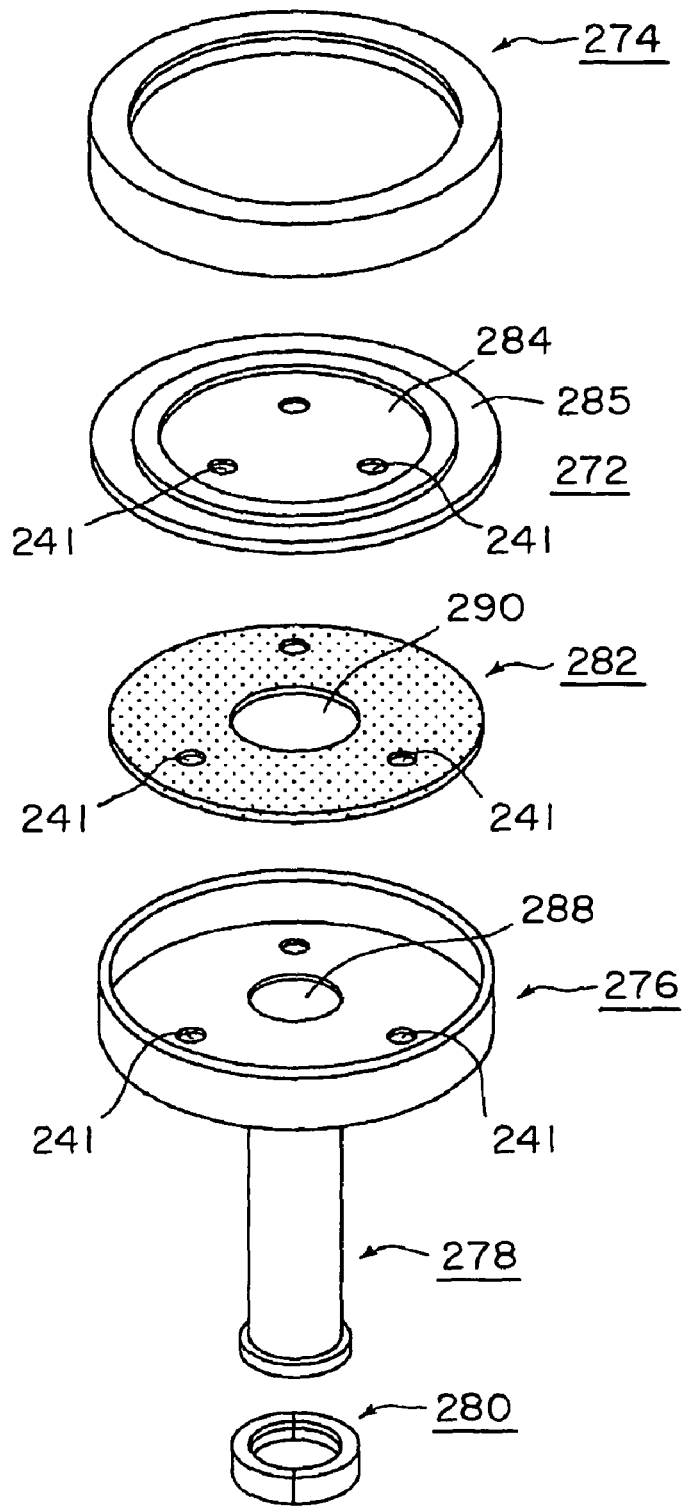
F I G. 8

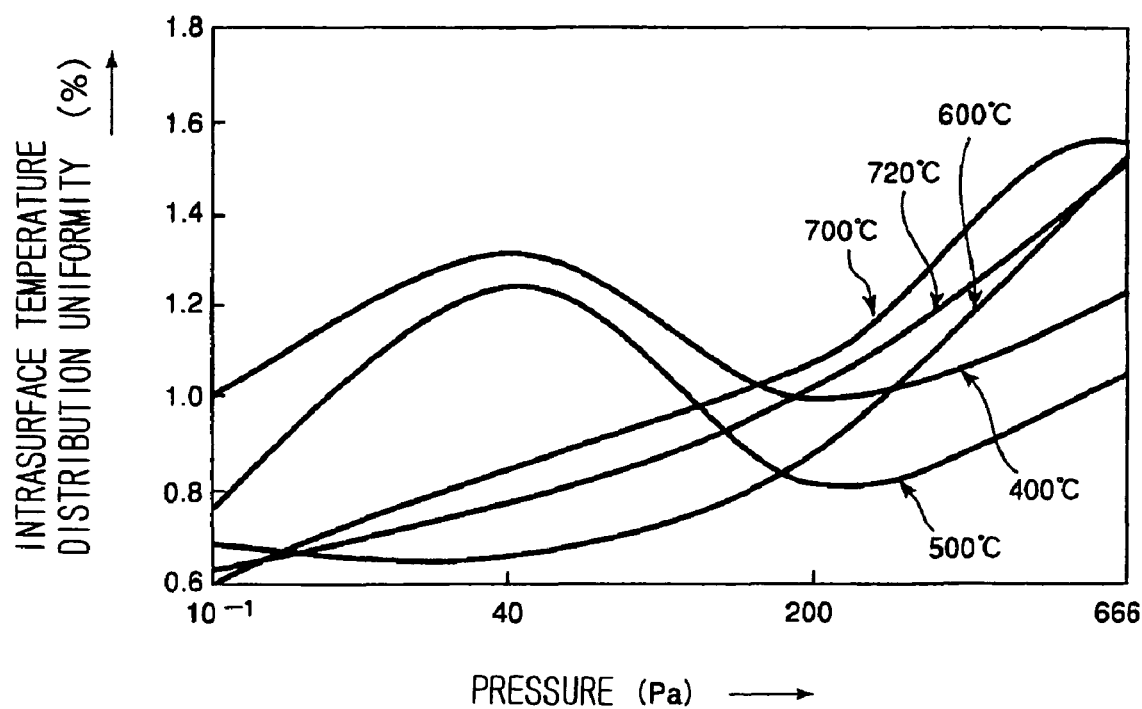
F I G. 9

LOADING TABLE AND HEAT TREATING APPARATUS HAVING THE LOADING TABLE

TECHNICAL FIELD

The present invention relates to a support table structure for supporting a workpiece, such as a semiconductor wafer, and a thermal processing system provided with the same.

BACKGROUND ART

A workpiece, such as a semiconductor wafer, is subject repeatedly to single-wafer processing processes, such as a film deposition process, an etching process, a thermal process, a modifying process and a crystallization process to build a desired semiconductor integrated circuit on the workpiece. Those processes use necessary process gases. For example, the film deposition process uses film forming gases, the modifying process uses ozone gas, the crystallization process uses an inert gas, such as $N_2$ gas, and $O_2$ gas. Those process gases are supplied into a processing vessel.

For example, a single-wafer thermal processing system for processing a single wafer at a time by a heat treatment process places a support table internally provided with, for example, a resistance heater in a processing vessel capable of being evacuated, supplies predetermined process gases into the processing vessel after mounting a semiconductor wafer on top of the support table, and processes the wafer by various thermal processes under predetermined process conditions.

The support table is disposed in the processing vessel with its surface exposed to the atmosphere in the processing vessel. Therefore, a small amount of heavy metals contained in materials of which the support table is made, for example, a ceramic material, such as AlN, and metallic materials is caused to diffuse into the interior space of the processing vessel by heat. Those diffused substances cause metal contamination and organic contamination. Very severe contamination preventing measures have been desired to prevent metal contamination and organic contamination in recent years where organometallic compounds are used as source gases for film deposition.

Usually, the heater incorporated into the support table is divided into a plurality of concentric circular sections. The respective temperatures of the sections are controlled individually to heat the support table in an optimum temperature distribution for processing a wafer. If magnitudes of power supplied to the sections of the heater are greatly different from each other, parts of the support table respectively corresponding to the sections of the heater are subject to greatly different thermal expansions, respectively, and, in some cases, the support table breaks. The insulation resistance of AlN decreases greatly and leakage current flows when AlN is exposed to high-temperature heat. Therefore, process temperature has been unable to be increased beyond about 650° C.

When the thermal process is a film deposition process for depositing a thin film on a surface of a wafer, unnecessary films are deposited inevitably on the surface of the support table and the inside surfaces of the processing vessel in addition to the deposition of a desired film on a surface of the wafer. If the unnecessary films come of the surfaces of the support table and the processing vessel, particles that reduce product yield are produced. A cleaning process is executed periodically or at indeterminate intervals to remove the unnecessary films. The cleaning process etches off the unnecessary films by supplying an etching gas into the processing vessel or removes the unnecessary films by immersing structural members disposed inside the processing vessel in an etchant, such as a nitric acid solution.

A technique for contamination prevention or reducing the frequency of the cleaning process proposed in JP 63-278322 A forms a support table by covering a heating element with a quartz casing. A technique for the same purpose proposed in JP 07-078766 A uses a support table constructed by placing a resistance heating element in a quartz case. Techniques proposed for the same purpose in JP 03-220718 A and JP 06-260430 A use a support table formed by sandwiching a heater between quarts plates.

Those prior art techniques using a support table covered with a quartz cover are effective in suppressing contamination, such as metal contamination, to some extent. However the effect of the prior art techniques is not fully satisfactory. When the quarts plates are transparent, a temperature distribution on the heating element is reflected on the temperature of the wafer and the wafer is hated in an uneven intrasurface temperature distribution. Moreover, in some cases, unnecessary films are deposited in patches or irregularities on the back surface of the support table or on a cover covering the back surface of the support table. Since thick parts and thin parts of the unnecessary films deposited in patches or irregularities have different emissivities, respectively. Consequently, temperature is distributed in an uneven temperature distribution on the surface of the support table, intrasurface temperature distribution on the water becomes uneven, and thermal process to the wafer cannot be achieved uniformly.

The unnecessary films deposited on the surfaces of the support table and the cover peel of comparatively easily at an early stage. Since the cleaning process needs to be carried out before the unnecessary films peel off, maintenance work including the cleaning process needs to be carried out frequently at short intervals. When the support table, namely, a heating structure, is divided into heating zones which can be individually heated and the levels of power supplied to the zones are distributed in a wide range, the support table may possibly break due to the different thermal expansions of the materials forming the zones of the support table.

The present invention has been made in view of those problems to solve those problems effectively.

Accordingly, it is an object of the present invention to provide a support table structure capable of surely suppressing the occurrence of contamination, such as metal contamination, having high heat conductivity, suitable for a high-temperature thermal process and capable of being heated uniformly by wide-range adjustment, and to provide a thermal processing system provided with the support table structure.

Another object of the present invention is to provide a support table structure capable of eliminating the detrimental thermal effect of unnecessary films deposited in patches thereon and of maintaining the surface thereof in a highly uniform intrasurface temperature distribution, and to provide a thermal processing system provided with the support table structure.

A third object of the present invention is to provide a support table structure capable of effectively preventing unnecessary films deposited thereon to reduce the frequency of maintenance work, such as a cleaning process, and to provide a thermal processing system provided with the support table structure.

A fourth object of the present invention is to provide a support table structure including a support table having a plurality of hating zones and capable of maintaining the surface of the wafer in a highly uniform intrasurface temperature distribution by setting differences in driving power flexibility among the heating zones and of performing a special heating process, and to provide a thermal processing system provided with the support table structure.

DISCLOSURE OF THE INVENTION

The present invention provides a support table structure in a first aspect of the present invention including: a support table, for supporting a workpiece thereon to subject the workpiece to a predetermined thermal process in a processing vessel, provided with a heating means for heating the workpiece; and a support post standing on the bottom of the processing vessel and supporting the support table; characterized by a heat-resistant upper surface covering member, a heat-resistant side surface covering member and a heat-resistant lower surface covering member respectively covering the upper, the side and the lower surface of the support table.

Since the upper, the side and the lower surface of the support table for supporting the workpiece thereon are covered with the heat-resistant covering members, thermal diffusion of contaminative metal atoms from the support table can be prevented, and contamination, such as metal contamination and organic contamination, can be prevented.

The present invention provides a support table structure in a second aspect of the present invention including: a support table, for supporting a workpiece thereon to subject the workpiece to a predetermined thermal process in a processing vessel, provided with a heating means for heating the workpiece; and a support post standing on the bottom of the processing vessel and supporting the support table; characterized by a heat-resistant, opaque back cover disposed under the lower surface of the support table.

Since the heat-resistant, opaque back cover is disposed under the lower surface of the support table, the distribution of emissivity on the surface of the opaque back cover remain substantially uniform even if unnecessary films are deposited in patches (irregularities) on the surface (lower surface). Consequently, the support table and the workpiece can be heated in a high intrasurface temperature distribution.

In the support table structure in the second aspect of the present invention, the upper and the side surface of the support table and the lower surface of the opaque back cover may be covered with upper, side and lower surface covering members, respectively.

When the upper and the side surface of the support table and the lower surface of the opaque back cover member are thus covered with the upper, the side and the lower surface covering member, respectively, thermal diffusion of contaminative metal atoms from the support table can be prevented, and contamination, such as metal contamination and organic contamination, can be prevented.

In the support table structure in first or the second aspect of the present invention, the upper cover member may have a diameter substantially equal to that of the support table, a raised part may be formed on the upper surface of the upper surface covering member, and a recess for receiving the workpiece may be formed in the raised part.

In the support table structure in the first or the second aspect of the present invention, the upper surface of a peripheral part of the upper surface covering member may be contiguously covered with a part of the side surface covering member.

In the support table structure in the first or the second aspect of the present invention, the side surface of the support table may be covered with an opaque covering member made of opaque quartz glass.

In the support table in the second aspect of the present invention, a space may be formed between the opaque back cover and the lower surface covering member.

In the support table in the second aspect of the present invention, projections may project from the lower surface of the opaque back cover to define the space between the opaque back cover and the lower surface covering member.

The present invention provides a support table structure in a third aspect of the present invention including: a support table for supporting a workpiece thereon to subject the workpiece to a predetermined thermal process in a processing vessel; and a support post standing on the bottom of the processing vessel and supporting the support table; characterized in that the support table and the support post are made of quartz glass, and a heating means is embedded in the support table.

Since the support table is made of quartz glass, thermal diffusion of contaminative metal atoms from the support table can be prevented, and contamination, such as metal contamination, can be prevented.

In the support table structure in the third aspect of the present invention, the support post may have a cylindrical shape, and power supply lines for supplying power to the heating means may be passed through a central part of the support table and may be extended through the cylindrical support post.

In the support table structure in the third aspect of the present invention, the support table may be built by bonding together a top plate, a middle plate and a bottom plate, wiring grooves for holding the heating means may be formed in either the lower surface of the top plate or the upper surface of the middle plate, and a wiring groove for holding the power supply lines connected to the heating means may be formed in either the lower surface of the middle plate or the upper surface of the bottom plate.

In the support table structure in the third aspect of the present invention, the upper surface of the support table may be covered with an opaque temperature-equalizing plate.

The opaque temperature-equalizing plate improves the uniformity of intrasurface temperature distribution on the workpiece.

In the support table structure in the third aspect of the present invention, the support table may be provided with a purging gas supply pore to supply a purging gas over the upper surface of the support table, and a gas supply quartz pipe may be connected to the purging gas supply pore.

In the support table structure in the third aspect of the present invention, the quartz pipe may be extended outside the support post and may have upper and lower ends welded to the support table and the support post, respectively.

In the support table structure in the third aspect of the present invention, the quartz glass may be transparent.

In the support table structure in the third aspect of the present invention, a heat-resistant, opaque back cover may be disposed under the lower surface of the support table.

When the heat-resistant, opaque back cover is disposed under the lower surface of the support table, the emissivity of the surface of the opaque back cover remain substantially uniform even if unnecessary films are deposited in patches (irregularities) on the surface (lower surface) of the opaque back cover. Consequently, the surface of the support table and the workpiece can be heated in highly uniform intrasurface temperature distribution.

In the support table structure in the third aspect of the present invention, the upper, the side and the lower surface of the support table may be covered with upper, side and lower surface covering members, respectively.

When the upper, the side and the lower surface of the support table are covered with the upper, the side and the lower surface covering member, respectively, thermal diffusion of contaminative metal atoms and such from the support table can be prevented and hence various types of contamination, such as metal contamination, can be prevented.

When the support table and the side and the lower surface covering member are made of quartz, contamination, such as metal contamination due to the thermal diffusion of contaminants from the support table and the side and the lower surface covering member can be suppressed and support table can be prevented from being exposed to source gases. Consequently, interval between the successive wet cleaning cycles for cleaning the support table can be extended, the life of the support table can be extended, and the support table can be kept in its initial shape for a long time.

In the support table structure in the third aspect of the present invention, the support post is stood up on a cushioning member to prevent the breakage of the support post.

In the support table structure in the second or the third aspect of the present invention, the opaque back cover is made of opaque quartz glass.

In the support table structure in the first, the second or the third aspect of the present invention, the side surface of the support post may be covered with a heat-resistant support post covering member.

When the support post supporting the support table is thus covered with the support post covering member, metal contamination can be prevented and the support post can be prevented from being exposed to source gases.

In the support table structure in the first, the second or the third aspect of the present invention, the upper, the side and the lower surface covering member and the support post covering member may constitute a cover assembly, the lower surface covering member and the support post covering member may be formed integrally in a single member, and the cover assembly may be able to be assembled and disassembled.

The cover assembly that can be assembled and disassembled facilitates quickly completing maintenance work, such as cleaning by a wet cleaning process.

In the support table in the second or the third aspect of the present invention, the covering members excluding the upper surface covering member and the opaque back cover may be made of transparent quartz glass, and the surfaces of the covering members made of transparent quartz glass may be finished by a surface roughening process to prevent films deposited thereon from peeling off.

Unnecessary films deposited on the surfaces of the covering members and likely to peel off and to produce particles cannot easily peel off. Therefore, the period of maintenance work, namely, the cleaning process, can be extended.

In the support table in the first, the second or the third aspect of the present invention, a sealing member may be disposed near a lower joining part of the support post, and the sealing member may be shielded from heat radiated by the support table by an opaque shielding member.

The sealing member disposed near the lower joining part of the support post can be shielded from heat radiated by the support table by the opaque shielding member to protect the sealing member from damaging by heat.

In the support table in the first, the second or the third aspect of the present invention, the support post may be made of an opaque material, the support post may be internally provided with an opaque member to protect the sealing member disposed near the lower joining part of the support post from heat radiated by the support table.

The present invention provides a thermal processing system in a fourth aspect of the present invention including: a processing vessel capable of being evacuated; the support table structure in the first, the second or the third aspect of the present invention; and a gas supply system for supplying process gases into the processing vessel.

In the thermal processing system in the fourth aspect of the present invention, the heating means for heating the support table is divided into inner and outer heating sections respectively corresponding to inner and outer zones in the support table.

BRIEF DESCRIPTION OF THE DRAWINGS

FIG. 3 is an exploded perspective view of a cover structure included in the support table structure shown in FIG. 2;

FIG. 4 is a sectional view of a support table structure in a second embodiment according to the present invention;

FIG. 8 is an exploded perspective view of a cover structure included in the support table structure shown in FIG. 4;

FIG. 9 is a graph showing the dependence of intrasurface temperature distribution on a support table on pressure;

BEST MODE FOR CARRYING OUT THE INVENTION

A thermal processing system embodying the present invention and including a support table structure embodying the present invention will be described with reference to FIGS. 1 to 13.

Figure 1:
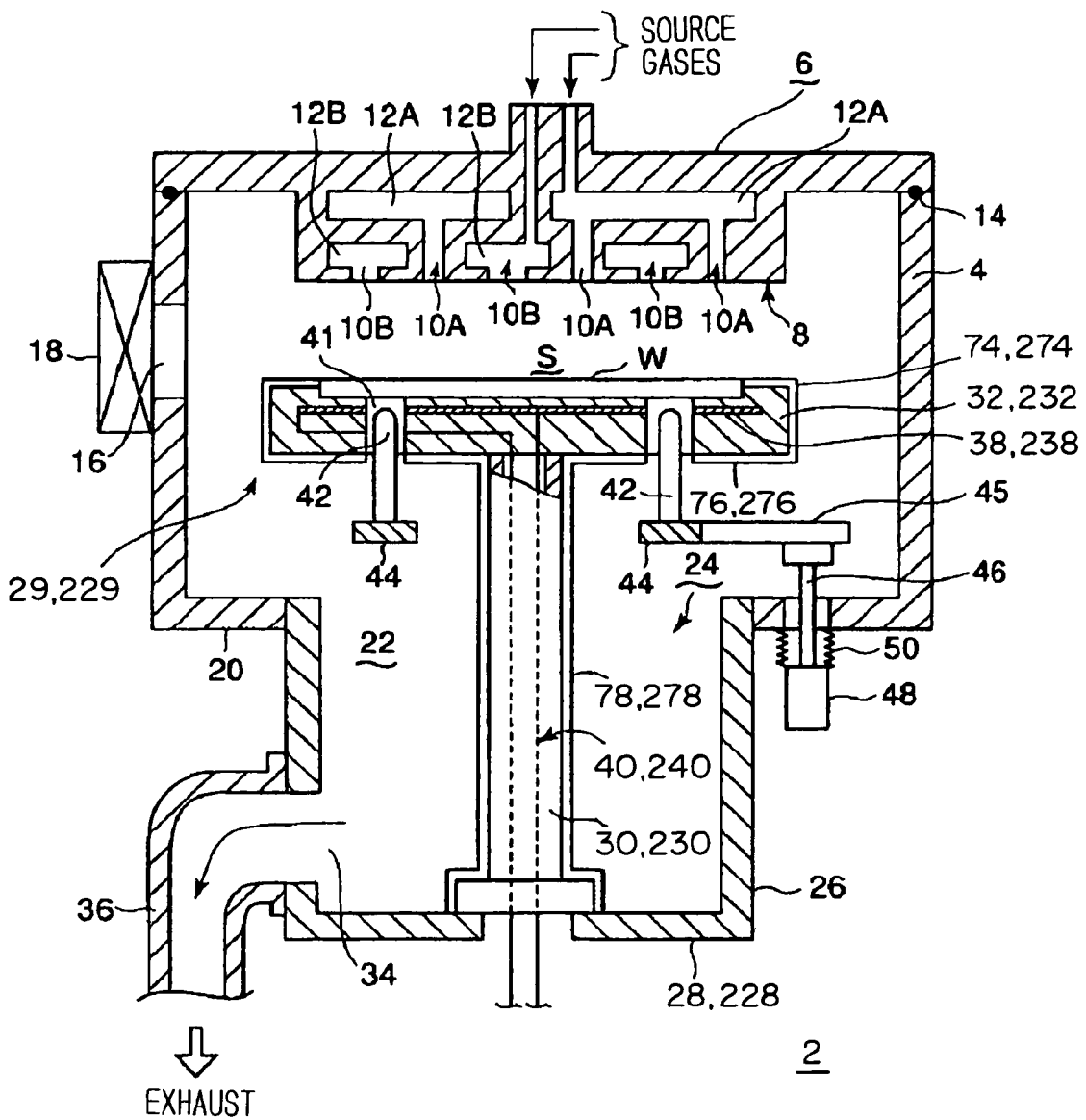
FIG. 1 is a schematic sectional view of a thermal processing system embodying the present invention provided with a support table structure embodying the present invention.
Figure 2:
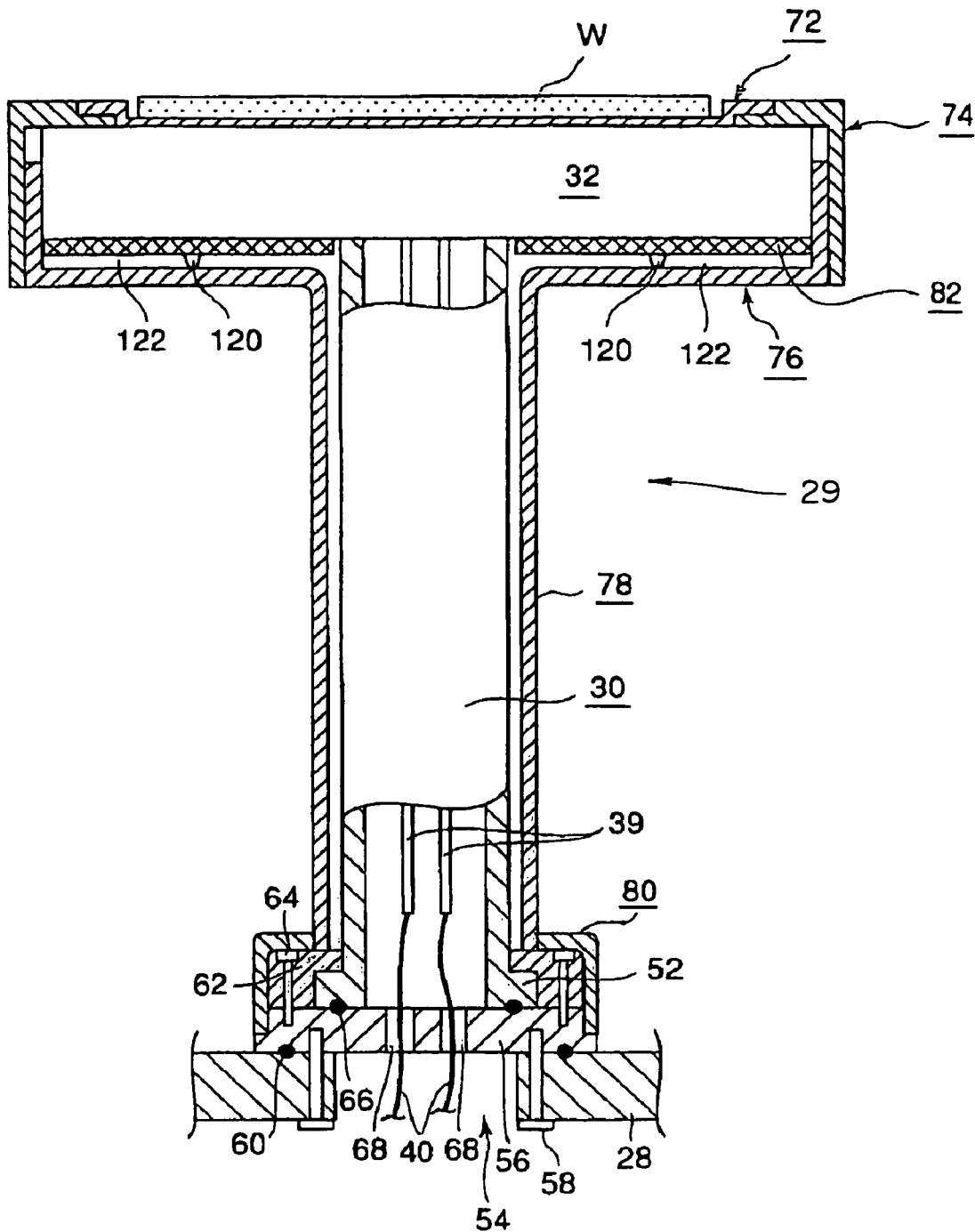
FIG. 2 is a sectional view of a support table structure in a first embodiment according to the present invention.
Figure 5:
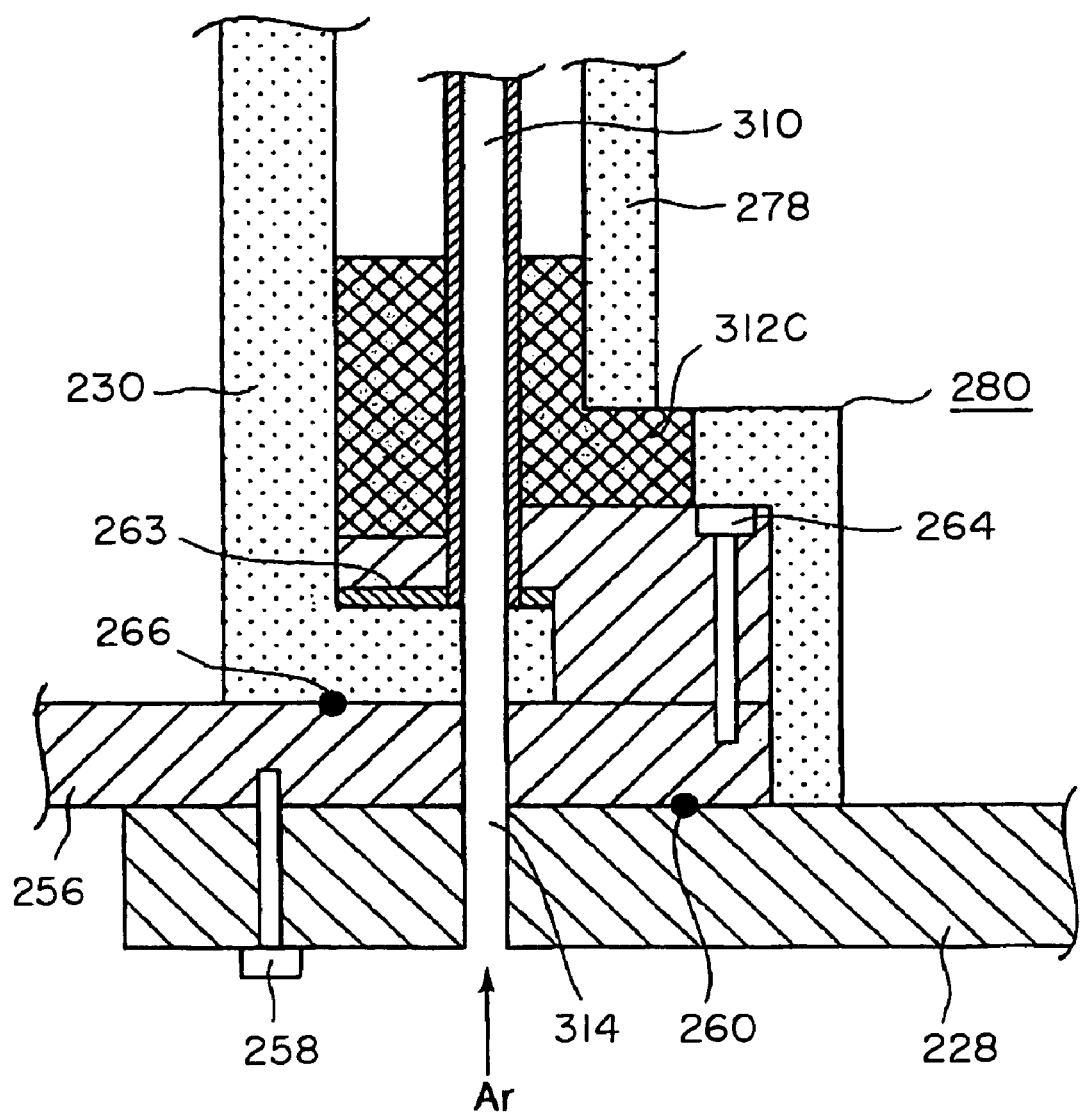
FIG. 5 is an enlarged, fragmentary sectional view of a lower end part of a support post included in the support table structure shown in FIG. 4.

FIGS. 1 to 3 show a thermal processing system provided with a support table structure in a first embodiment according to the present invention.

FIG. 1 is a schematic sectional view of a thermal processing system embodying the present invention provided with a support table structure embodying the present invention, FIG. 2 is a sectional view of a support table structure in a first embodiment according to the present invention and FIG. 3 is an exploded perspective view of a cover structure included in the support table structure shown in FIG. 2.

Referring to FIGS. 1 to 3, a thermal processing system 2 has a processing vessel 4 made of aluminum and defining, for example, a substantially cylindrical processing space S. The processing vessel 4 has a top wall provided with a shower head 6. Process gases, such as source gases, are supplied through the shower head 6 into the processing vessel 4. Gases are jetted through gas jetting holes formed in a gas jetting wall 8 included in the shower head 6 into the processing space S of the processing vessel 4.

The interior of the shower head 6 is divided into tow gas diffusion chambers 12A and 12B. The gas supplied into the shower head 6 is diffused horizontally and then is jetted through gas jetting holes 10A and 10B communicating with the gas diffusion chambers 12A and 12B into the processing space S. The gas jetting holes 10A and 10B are arranged in an array. The shower head 6 is made of, for example, nickel, a nickel alloy, such as Hastelloy®, aluminum or an aluminum alloy. The shower head 6 may have a single diffusion chamber. A sealing member 14, such as an O ring, is held at the joint of the shower head 6 and the open upper end of the processing vessel 4 to seal the processing vessel 4 hermetically.

The processing vessel 4 has a side wall provided with an opening 16. A semiconductor wafer W is carried into and carried out of the processing vessel 4 through the opening 16. The opening 16 is closed hermetically by a gate valve 18.

The processing vessel 4 has a bottom wall 20 surrounding an exhaust trapping space 22. More specifically, the bottom wall 20 is provided with a large central opening 24. A bottomed cylindrical member 26 is fitted in the central opening 24 of the bottom wall 20 so as to extend downward from the bottom wall 20. The bottomed cylindrical member 26 defines the exhaust trapping space 22. The bottomed cylindrical member 26 has a bottom wall 28. A support table structure 29 embodying the present invention is stood up on the bottom wall 28. The support table structure 29 has a cylindrical support post 30 made of a ceramic material, such as AlN, and a support table 32 connected to the upper end of the support post 30.

An entrance 24 of the exhaust trapping space 22 has a diameter smaller than that of the support table 32. The process gas flows down through a space around the circumference of the support table 32 into a space extending under the support table 32 and then flows down through the entrance 24 into the exhaust trapping space 22. An exhaust opening 34 is formed in a lower part of the side wall of the cylindrical member 26 so as to open into the exhaust trapping space 22. An exhaust pipe 36 has one end connected to the exhaust opening 34 and the other end connected to a vacuum pump, not shown. The vacuum pump evacuates the processing space S in the processing vessel 4 and the exhaust trapping space 22.

A pressure regulating valve, not shown, provided with an adjustable valve element is placed in the exhaust pipe 36. The pressure regulating valve is able to regulate its opening automatically to maintain the interior of the processing vessel at a desired pressure or to adjust the pressure quickly to a desired pressure.

The support table 32 is provided internally with a resistance heater 38 made of, for example, molybdenum in a predetermined pattern. The resistance heater 38 is embedded in a sintered ceramic layer made of, for example, AlN. The support table 32 is capable of supporting a semiconductor wafer W on its upper surface. Power supply conductors 40 extended through the support post 30 are connected to the resistance heater 38 to supply controlled power to the resistance heater 38. The power supply conductors 40 are extended in quartz pipes 39, respectively, and are connected to a power supply cable in a lower part of the support post 30. The resistance heater 38 is divided into concentric inner and outer heating sections. Magnitudes of power supplied to the inner and the outer section are controlled individually. Although only the two power supply conductors 40 are shown in FIG. 2, actually, four power supply conductors 40 are connected to the resistance heater 38.

The support table 32 is provided with, for example, three vertical through holes 41. Only two of the three vertical through holes 41 are shown in FIG. 1. Lifting pins 42 are loosely fitted in the vertical through holes 41 so as to be able to move vertically. The lifting pins 42 rest on a circular raising ring 44 made of a ceramic material, such as alumina, and disposed below the lifting pins 42. An arm 45 extending from the raising ring 44 is connected to a vertically movable raising rod 46 penetrating the bottom wall 20 of the processing vessel 4. The raising rod 46 can be vertically moved by an actuator 48. The lifting pins 42 are elevated so as to project upward from the vertical through holes 41 to receive or to send out a wafer W. A part, penetrated by the raising rod 46, of the bottom wall 20 is covered with a stretchable bellows 50 to keep the processing vessel 4 hermetically sealed during the vertical movement of the raising rod 46.

Referring to FIG. 2, the cylindrical support post 30 fixedly supporting the support table 32 is made of, for example, AlN. A flange 52 is formed on the lower end of the support post 30. In FIG. 2, the interior structural members and the lifting pins 42 are omitted. The bottom wall 28 is provided with a central opening 54 of a predetermined size. A base plate 56 made of, for example, an aluminum alloy and having a diameter slightly greater than that of the base plate 56 is placed on the upper surface of the bottom wall 28 and is fastened to the bottom wall 28 with bolts 58. A sealing member 60, such as an O ring, is held between the upper surface of the bottom wall 28 and the lower surface of the base plate 56 to seal hermetically the gap between the bottom wall 28 and the base plate 56. The support post 30 is stood on the base plate 56. A holding member 62 is made of, for example, an aluminum alloy and has the shape of a ring having an inverted L-shaped cross section. The holding member 62 is put on the flange 52 so as to cover the flange 52 and the holding member 62 is fastened to the base plate 56 with bolts 64 to hold the flange 52 fixedly between the holding member 62 and the base plate 56. A sealing member 66, such as an O ring, is held between the upper surface of the base plate 56 and the lower surface of the flange 52 to seal hermetically the gap between the base plate 56 and the flange 52. The base plate 56 is provided with a plurality of through holes 68. The power supply conductors 40 are extended outside through the through holes 68. The interior of the cylindrical support post 30 is at the atmospheric pressure. The upper end of the support post 30 is fixedly and hermetically joined to a central part of the back surface of the support table 32 by welding or the like. The support post 30 may be airtightly sealed.

A cover assembly featuring the present invention is combined with the support table structure 29. Referring to FIG. 3, the cover assembly is formed by assembling an upper surface covering member 72 having the shape of a disk and capable of covering a wafer support part, for supporting a semiconductor wafer W thereon, of the upper surface of the support table 32, a peripheral surface covering member 74 having the shape of a ring and capable of covering a peripheral part of the support table 32 and of partly or entirely covering the side surface of the support table 32, a lower surface covering member 76 capable of partly or entirely covering the side surface of the support table 32 and of covering the lower surface of the support table 32, a support post covering member 78 capable of entirely covering the side surface of the support post 30, and a lower end covering member 80 for covering a lower end part of the support post 30. An opaque back cover 82 having an annular shape is held in contact with the lower surface (back surface) of the support table 32 between the lower surface of the support table 32 and the lower surface covering member 76. The lower surface covering member 76 covers the lower surface of the opaque back cover 82.

Those covering members 72, 74, 76, 78 and 80 and the back cover 82 are made of heat-resistant, corrosion-resistant materials. Since a wafer W is seated directly on the upper surface covering member 72, the upper surface covering member is made of a ceramic material scarcely causing contamination, such as metal contamination or organic contamination, and having a high thermal conductivity, such as SiC. The opaque back cover 82 is made of a material scarcely causing contamination, such as metal contamination or organic contamination, and scarcely transmitting heat, such as opaque quartz glass. The other covering members 74, 76, 78 and 80 are made of a material scarcely causing metal contamination or organic contamination, such as transparent quartz glass.

The upper surface covering member 72 made of SiC having a high thermal conductivity has the shape of a circular plate. The upper surface covering member 72 is provided with a central recess 84 for receiving and supporting a wafer W directly therein. The depth of the central recess 84 is approximately equal to the thickness of the wafer W. The upper surface covering member 72 is provided with through holes 41 through which the lifting pins 42 (FIG. 1) extend upward. The thickness of the upper surface covering member 72 is, for example, on the order of 3.0 mm.

The peripheral surface covering member 74 made of transparent quartz glass has the shape of a ring having an inverted L-shaped cross section. The peripheral surface covering member 74 covers a peripheral part of the upper surface of the support table 32 and partly or entirely covers the side surface of the support table 32. The peripheral surface covering member 74 can be removably seated on a peripheral part of the support table 32 as shown in FIG. 2. An annular step 86 is formed in the inside surface of the peripheral surface covering member 74. The upper surface covering member 72 is detachably supported on the peripheral surface covering member 74 with a peripheral part thereof seated on the annular step 86. The thickness of the peripheral surface covering member 74 is, for example, between about 2.0 and about 3.0 mm.

The lower surface covering member 76 made of transparent quartz glass and the support post covering member 78 made of transparent quartz glass are joined together by welding. The lower surface covering member 76 is a circular vessel capable of partly or entirely covering the side surface of the support table 32 and of entirely covering the lower surface of the support table 32. The lower surface covering member 76 is provided in its central part with an opening 88 for receiving an upper end part of the support post 30 as shown in FIG. 2. The upper end of the support post covering member 78 is welded to the edge of the opening 88. The lower surface covering member 76 is capable of removably receiving the entire support table 32 therein. The inside diameter of the side wall of the peripheral surface covering member 74 is slightly greater than the outside diameter of the side wall of the lower surface covering member 76. As shown in FIG. 2, the peripheral surface covering member 74 and the lower surface covering member 76 are separably combined together such that the side wall of the lower surface covering member 76 is fitted closely in the side wall of the peripheral surface covering member 74 and the respective lower end surfaces of the peripheral surface covering member 74 and the lower surface covering member 76 are flush with each other.

Thus, the side surface of the support table 32 is completely covered. Through holes 41 are formed in the bottom wall of the lower surface covering member 76. The lifting pins 42 (FIG. 1) are extended through the through holes 41.

The support post covering member 78 welded to the lower surface covering member 76 has an inside diameter slightly greater than the outside diameter of the flange 52. The support post covering member 78 is seated on the holding member 62 as shown in FIG. 2. When the support table 32 needs to be removed, the assembly of the lower surface covering member 76 and the support post covering member 78 is pulled down relative to the support post 30 to separate the lower surface covering member 76 from the support table 32. The lower surface covering member 76 has a wall thickness, for example, on the order of 3.0 mm and the support post covering member 78 has a wall thickness, for example, on the order of 5.0 mm.

The lower end covering member 80 made of transparent quartz glass is formed in the shape of a ring having an inverted L-shaped cross section to cover the exposed surfaces of the holding member 62 and the base plate 56. The lower end covering member 80 is a half ring split into two halves to facilitate putting the lower end covering member 80 in place and removing the same. The lower end covering member 80 does not necessarily need to be split and may be formed in a single piece.

The flange 52 has a diameter slightly smaller than the inside diameter of the support post covering member 78. The support post 30 can be pulled upward and can be extracted from the support post covering member 78 after unfastening the bolts 58 and 64 and removing the base plate 56 and the holding member 62.

The opaque back cover 82 is formed in an annular shape to cover the entire lower surface (back surface) of the support table 32 excluding a part joined to the support post 30. The support post 30 is passed through a central opening 90 formed in a central part of the back cover 82. Through holes 41 are formed in the opaque back cover 82 to pass the lifting pins 42 therethrough. The upper surface of the opaque back cover 82 is in close contact with the lower surface of the support table 32. Three projections 120 are formed on the lower surface of the back cover 82 to form a space 122 between the opaque back cover 82 and the lower surface covering member 76. Thus the opaque back cover 82 is allowed to move to prevent the opaque back cover 82 from cracking. Only two of the three projections 120 are shown in FIG. 2. The projections 120 may be formed on the upper surface of the lower surface covering member 76 instead of on the lower surface of the opaque back cover 82.

The opaque back cover 82 is made of, for example, cloudy, opaque quartz glass containing numerous fine bubbles. The opaque back cover 82 intercepts and reflects heat radiated from the lower surface of the support table 32. The opaque back cover 82 may be made of any opaque, heat-resistant material and it is desirable that the opaque back cover 82 has a high reflectance.

The respective surfaces of the covering members made of transparent quartz glass, namely, the peripheral surface covering member 74, the lower surface covering member 76, the support post covering member 78 and the lower end covering member 80, are finished by a surface roughening process, such as a sandblasting process, and have fine irregularities. The anchoring effect of the fine irregularities makes unnecessary films deposited on those surfaces difficult to peel off.

A thermocouple, not shown, is attached to the support table 32 to measure the temperature of the support table for temperature control. The support table 32 is provided with gas supply ports for introducing an inert gas, such as $N_2$ gas or Ar gas, onto the back surface of the wafer W to transmit heat to the wafer W at a high heat transfer rate.

The operation of the thermal processing system will be described.

A carrying arm, not shown, holds a new semiconductor wafer W, carries the semiconductor wafer W through the opened gate valve 18 and the opening 16 into the processing vessel 4, and places the semiconductor wafer W on the raised lifting pins 42. Then, the lifting pins 42 are lowered to seat the wafer W on the upper surface of the support table 32, more specifically, on the bottom surface of the central recess 84 formed in the upper surface of the upper surface covering member 72.

Subsequently, source gases, such as some of $TiCl_4$, $H_2$, $NH_3$, $WF_6$, $SiH_4$, PET and $O_2$, are supplied at controlled flow rates, respectively, into the shower head 6. The source gases are jetted through the gas jetting holes 10 into the processing space S. The vacuum pump, not shown, connected to the exhaust pipe 36 is operated continuously to suck atmospheres in the processing vessel 4 and the exhaust trapping space 22. The opening of the pressure regulating valve is regulated to maintain the processing space S at a predetermined process pressure. The wafer W is heated at temperatures between about 400 and about 700° C. Thus, a thin film of Ti, TiN, W, WSi or $Ta_2O_5$ is deposited on a surface of the wafer W.

It is possible that heavy metals slightly contained in the support table 32 are introduced into the processing vessel 4 by thermal diffusion during the film depositing process in which the support table 32 made of, for example, AlN is heated at high temperatures. According to the present invention, the support table 32 is covered entirely with the upper surface covering member 72 made of a heat-resistant material expected not to cause metal and organic contamination, such as SiC, and the peripheral surface covering member 74 and the lower surface covering member 76 made of heat-resistant, transparent quartz glass expected not to cause metal and organic contamination. Therefore, the diffusion of heavy metals into the processing vessel 4 can be prevented and the semiconductor wafer W can be prevented from being contaminated with heavy metals and organic substances. The contamination, namely, metal contamination and organic contamination, can be sufficiently effectively prevented only by the upper surface covering member 72, the peripheral surface covering member 74 and the lower surface covering member 76.

The support post 30 made of, for example, AlN is completely covered with the support post covering member 78 made of, for example, transparent quartz glass. Covering the surface of the holding member 62 fixedly holding the lower end part of the support post 30 and the surface of the base plate 56 with the lower end covering member 80 made of transparent quartz glass can further improve the contamination preventing effect.

Heat generated by the resistance heater 38 embedded in the support table 32 can be efficiently transferred to the wafer W to heat the wafer W efficiently because the upper surface covering member 72 interposed between the support table 32 and the wafer W is made of a material having a thermal conductivity higher than that of transparent quartz glass, such as SiC. The upper surface covering member 72 may be made of quartz glass. Experiments proved that the temperature difference between the resistance heater 38 and the wafer W decreases when the upper surface covering member 72 is made of quartz glass instead of SiC.

As the film deposition process proceeds to deposit desired film on the surface of the wafer W, unnecessary films are deposited inevitably on the exposed surfaces of the covering members 74, 76, 78 and 80. Since the surfaces of the covering members 74, 76, 78 and 80 are finished by a surface roughening process and fine irregularities are formed in those surfaces, the anchoring effect of those surfaces provided with the fine irregularities makes the unnecessary films deposited on those surfaces difficult to peel off. Therefore, the period of the maintenance work, such as a cleaning process, can be extended and the operating ratio of the thermal processing system can be increased accordingly.

Unnecessary films tend to deposit in patches on the lower surface of the lower surface covering member 76 covering the lower surface of the support table 32 during the film deposition process. In the conventional thermal processing system, the unnecessary films deposited in patches develop an uneven heat radiation distribution on the support table. In the thermal processing system of the present invention, unnecessary films deposited in patches do not develop an uneven heat radiation distribution because the annular, opaque back cover 82 covers the lower surface of the support table 32 entirely. Therefore, the support table 32 is heated so as to radiate heat in a uniform heat radiation distribution and is heated in a desired uniform temperature distribution, namely, uniform intrasurface temperature distribution even if unnecessary films are deposited in patches on the lower surface of the lower surface covering member 76 and, consequently, the wafer W can be heated in a uniform intrasurface temperature distribution.

When the resistance heater 38 is divided into sections to heat zones of the support table 32 individually, the frequency of temperature tuning during the film deposition process can be reduced. Since the opaque back cover 82 is capable of reflecting heat radiated by the support table 32 to suppress the loss of radiation heat, the thermal efficiency of the resistance heater 38 can be increased accordingly.

Although the thermal processing system in this embodiment is provided with those covering members, only the opaque back cover 82 may be used to cover the lower surface of the support table 32. Even if only lower surface of the support table 32 is covered with the back cover 82, the support table 32 and the wafer W can be heated in a highly uniform intrasurface temperature distribution even if unnecessary films deposit in patches, the loss of radiation heat can be suppressed, and hence the thermal efficiency of the resistance heater 38 can be increased accordingly.

The two covering members, namely, the lower surface covering member 76 and the opaque back cover 82, are disposed on the lower side of the support table 32 in the thermal processing system. The lower surface covering member 76 may be omitted and the opaque back cover 82 may be welded to the upper end of the support post covering member 78.

The thermal processing system has high maintainability because only the covering members 72, 74, 76, 78 and 80 need to be cleaned by a wet or dry cleaning process.

In the thermal processing system embodying the present invention, both the support table 32 and the support post 30 supporting the support table 32 are made of AlN, the support table 32 and the support post 30 may be made of any suitable materials other than AlN without departing from the scope of the present invention.

Figure 6:
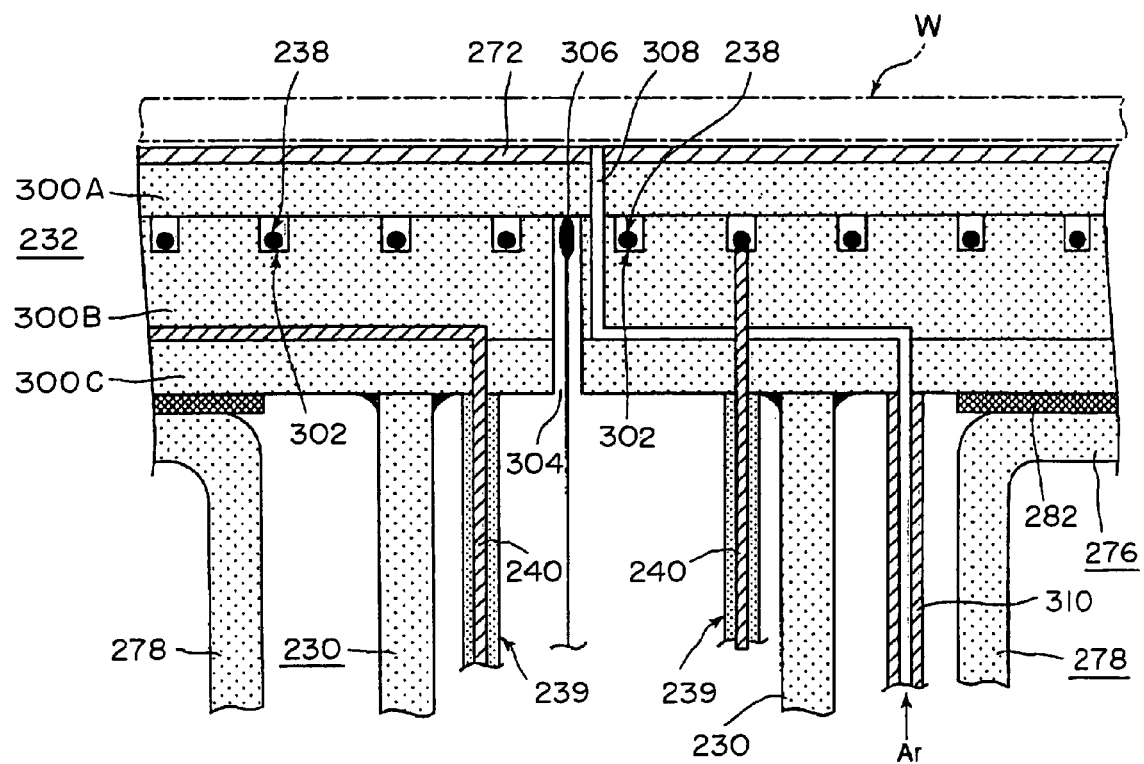
FIG. 6 is an enlarged sectional view of a part of a support table included in the support table structure shown in FIG. 4.
Figure 7:
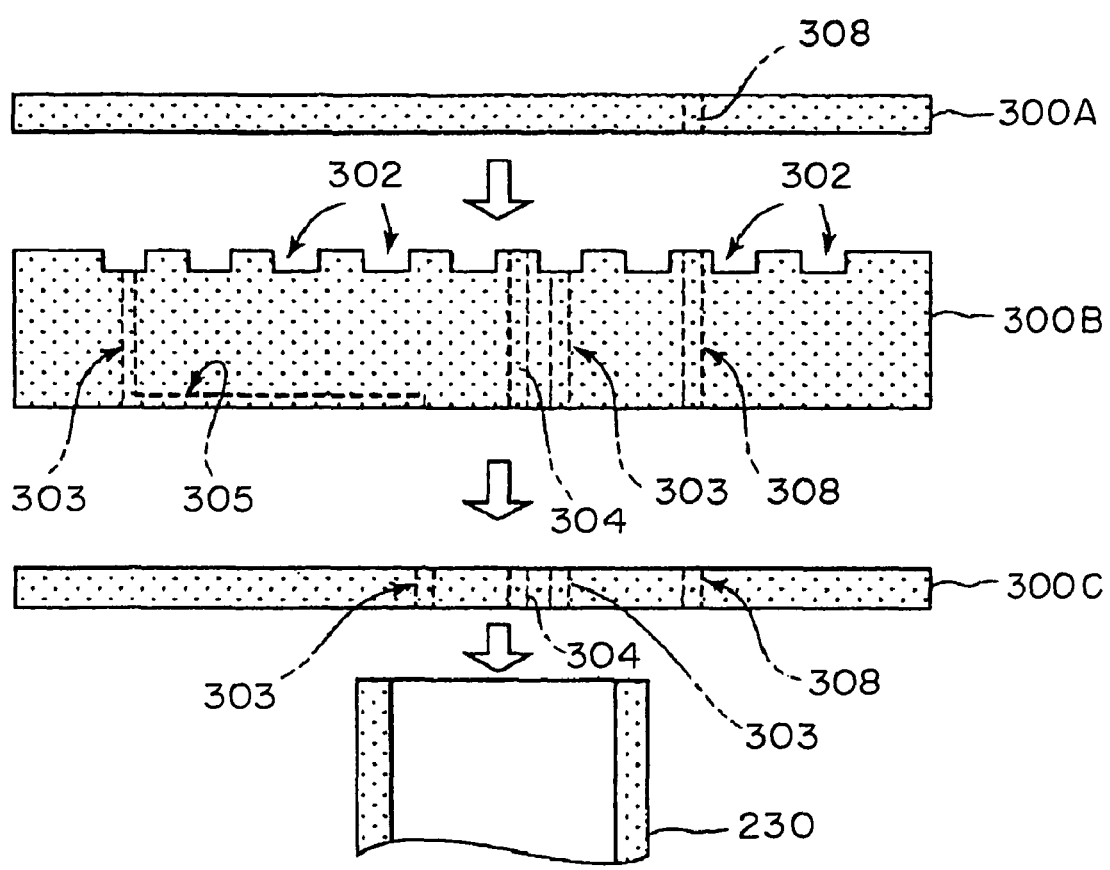
FIG. 7 is an exploded sectional view of the support table included in the support table structure shown in FIG. 4.

A support table structure 229 in a second embodiment according to the present invention will be described with reference to FIGS. 4 to 9. Referring to FIG. 4, the support table structure 229 includes a support table 232 and a support post 230. The support table 232 and the support post 230 are made of a highly heat-resistant, highly corrosion-resistant material, such as transparent quartz glass. The support table 232 and the support post 230 are covered with an upper surface covering member 272, a peripheral surface covering member 274, a lower surface covering member 276, a support post covering member 278, a lower end covering member 280 and an opaque back cover 282. As shown in FIG. 6, the support table 232 is a three-layer structure formed by superposing a top plate 300A, a middle plate 300B and a bottom plate 300C in that order and welding together the top plate 300A, the middle plate 300B and the bottom plate 300C. The thin upper surface covering member 272 made of an opaque material, such as SiC is removably attached to the top plate 300A. A wiring groove 302 is formed in the upper surface of the middle plate 300B so as to extend over the entire upper surface of the middle plate 300B. A carbon heating element of a resistance heater 238 is laid in the wiring groove 302. The resistance heater 238 is divided a plurality of concentric circular sections. The wiring groove 302 may be formed in the lower surface of the top plate 300A. The resistance heater 238 may be a two-layer heater having two vertically superposed heating layers. The support table 232 may be provided with additional quartz plates if the number of heating layers requires.

Wiring holes 303 are formed in proper parts of the middle plate 300B and the bottom plate 300C. Power supply lines connected to the resistance heater 238 are passed through the wiring holes 303. A wiring groove 305 for holding the power supply lines is formed in the lower surface of the middle plate 300B so as to extend radially toward the center of the support table 232. The wiring groove 305 may be formed in the upper surface of the bottom plate 300C. The top plate 300A, the middle plate 300B and the bottom plate 300C are joined together by welding to build the support table 232 after installing the heating element of the resistance heater 238 and the power supply lines 240 in and along the wiring grooves 302 and 305. The upper end of the cylindrical support post 230 made of, for example transparent quartz glass is welded to a central part of the lower surface of the support table 232.

The power supply lines 240 are gathered in a central part of the support table 232 and are extended downward from the substantially central part of the support table 232. The vertically extending part of the power supply lines 240 are covered with, for example, quartz tubes 239. The upper ends of the quartz tubes 239 are welded to the lower surface of the bottom plate 300C. A thermocouple holding hole 304 is formed through the bottom plate 300C and the middle plate 300B so as to reach the lower surface of the top plate 300A. A thermocouple 306 for measuring temperature for temperature control is inserted in the thermocouple holding hole 304.

A purge gas supply hole 308 is formed through the top plate 300A, the middle plate 300B and the bottom plate 300C to introduce a purge gas onto the back surface of the wafer W. A vertical gas supply pipe 310 (FIG. 6) made of transparent quartz glass is connected to the purge gas supply hole 308. The outlet of the purge gas supply hole 308 opens in a substantially central part of the support table 232 so as to distribute a purge gas uniformly over the upper surface of the support table 232. An opaque shielding member 312 is disposed adjacent to a lower end part of the support post 230 to shield sealing members 260 and 266 (FIG. 4), such as O rings, from heat radiated by the support table 232. More specifically, a cylindrical first opaque member 312A made of, for example, opaque quartz glass and forming a middle part of the support post 230 is welded to the support post 230. The length of the first opaque member 312A is, for example, on the order of 70 mm.

A second opaque member 312B having the shape of a disk and made of, for example, opaque quartz glass is fitted in the first opaque member 312A. An annular third opaque member 312C made of, for example, opaque quartz glass is disposed so as to cover the sealing members 260 and 266, and the support post covering member 278 is set on the third opaque member 312C. The opaque members 312A, 312B and 312C intercept radiant heat radiated by the support table 232 toward the sealing embers 260 and 266 to protect the sealing members 260 and 266 from the thermal damage. The term, "opaque quartz glass" signifies quartz glass capable of intercepting heat rays and radiant heat, such as cloudy quartz glass containing numerous fine bubbles or colored quartz glass. The entire support post 230 or a lower part, extending down from the first opaque member 312A, of the support post 230 may be made of opaque quartz glass. A groove is formed in the holding member 262 and the third opaque member 312C, and a gas supply pipe defining a gas supply passage 314 is held in the groove. The gas supply pipe 310 is installed outside the support post 230, and the upper and the lower end of the gas supply pipe 210 are welded to the support table 232 and a flange 252 formed on the lower end of the support post 230, respectively. Thus the gas supply pipe 210 is held firmly in place. Since the gas supply pipe 310 is installed outside the support post 230, the plurality of power supply lines 240 can be held inside the support post 230. A gas supply passage 314 is formed through a bottom member 228 and a base plate 256 so as to communicate with the gas supply pipe 310.

A cover assembly will be described. Referring to FIG. 8, the cover assembly is formed by assembling the upper surface covering member 272 having the shape of a disk and capable of covering a wafer support part, for supporting a semiconductor wafer W thereon, of the upper surface of the support table 232, the peripheral surface covering member 274 having the shape of a ring and capable of covering a peripheral part of the support table 232 and of partly or entirely covering the side surface of the support table 232, the lower surface covering member 276 capable of partly or entirely covering the side surface of the support table 232 and of covering the lower surface of the support table 232, the support post covering member 278 capable of entirely covering the side surface of the support post 230, and the lower end covering member 280 for covering a lower end part of the support post 230. The peripheral surface covering member 274 is seated on a peripheral part of the upper surface covering member 272. The opaque back cover 282 having an annular shape is held in contact with the lower surface (back surface) of the support table 232 between the lower surface of the support table 232 and the lower surface covering member 276. The lower surface covering member 276 covers the lower surface of the opaque back cover 282.

Those covering members 272, 274, 276, 278 and 280 and the back cover 282 are made of heat-resistant, corrosion-resistant materials. Since a wafer W is seated directly on the upper surface covering member 272, the upper surface covering member 272 is made of a ceramic material scarcely causing contamination, such as metal contamination, and having a high thermal conductivity, such as SiC. The opaque back cover 282 is made of a material scarcely causing contamination, such as metal contamination, and scarcely transmitting heat, such as opaque quartz glass. The other covering members 274, 276, 278 and 280 are made of a material scarcely causing metal contamination, such as transparent quartz glass.

The upper surface covering member 272 made of SiC having a high thermal conductivity has the shape of a thin, circular plate. The upper surface covering member 272 is provided with a central recess 284 for receiving and supporting a wafer W directly therein. The depth of the central recess 284 is approximately equal to the thickness of the wafer W. A peripheral part 285 of the upper surface covering member 272 is depressed to form a step. The upper surface covering member 272 is removably placed on the support table 232 so as to cover the upper surface of the support table 232 substantially entirely. The upper surface covering member 272 is provided with through holes 241 through which lifting pins 242 (FIG. 1) extend upward. The thickness of the upper surface covering member 272 is, for example, on the order of 6.5 mm.

The peripheral surface covering member 274 made of transparent quartz glass has the shape of a ring having an inverted L-shaped cross section and is capable of partly or entirely covering the side surface of the support table 232. The peripheral surface covering member 274 is removably put on the support table 232 and covers a peripheral part of the upper surface of the support table 232. The upper wall of the peripheral surface covering member 274 is seated on the depressed peripheral part 285 of the upper surface covering member 272. The peripheral surface covering member 274 can be removed from the upper surface covering member 272. The thickness of the peripheral surface covering member 274 is, for example, about 3 mm.

The lower surface covering member 276 made of transparent quartz glass and the support post covering member 278 made of transparent quartz glass are joined together by welding. The lower surface covering member 276 is a circular vessel capable of partly or entirely covering the side surface of the support table 232 and of entirely covering the lower surface of the support table 232. The lower surface covering member 276 is provided in its central part with an opening 288 for receiving an upper end part of the support post 230 as shown in FIG. 4. The upper end of the support post covering member 278 is welded to the edge of the opening 288. The lower surface covering member 276 is capable of removably receiving the entire support table 232 therein. The inside diameter of the side wall of the peripheral surface covering member 274 is slightly greater than the outside diameter of the side wall of the lower surface covering member 276. As shown in FIG. 4, the peripheral surface covering member 274 and the lower surface covering member 276 are separably combined together by closely fitting the side wall of the lower surface covering member 276 in the side wall of the peripheral surface covering member 274 so that a lower end part of the side wall of the peripheral surface covering member 274 and an upper end part of the side wall of the peripheral surface covering member 274 overlap each other Thus, the side surface of the support table 232 is completely covered. Through holes 41 are formed in the bottom wall of the lower surface covering member 276. The lifting pins 42 (FIG. 1) are extended through the through holes 41. The support post covering member 278 welded to the lower surface covering member 276 has an inside diameter slightly greater than the outside diameter of the flange 252 of the support post 230. The support post covering member 278 is seated on the holding member 262 as shown in FIG. 4. When the support table 232 needs to be removed, the support table can be extracted upward from the integrally formed assembly of the lower surface covering member 276 and the support post covering member 278. The respective wall thicknesses of the lower surface covering member 276 and the support post covering member 278 are, for example, between about 3 and about 5 mm.

The opaque back cover 282 is formed in an annular shape to cover the entire lower surface (back surface) of the support table 232 excluding a part joined to the support post 230. The support post 230 is passed through a central opening 290 formed in a central part of the back cover 282. Through holes 41 are formed in the opaque back cover 282 to pass the lifting pins 42 therethrough. The opaque back cover 282 is disposed between the lower surface of the support table 232 and the lower surface covering member 276. The opaque back cover 282 is supported by three projections, not shown, on the lower surface covering member 276. The opaque back cover 282 is made of, for example, cloudy, opaque quartz glass containing numerous fine bubbles. The opaque back cover 282 intercepts heat radiated from the lower surface of the support table 232.

As shown in FIG. 4, the flange 252 is formed on the lower end of the cylindrical support post 230 made of, for example, transparent quartz glass. In FIG. 4, the interior structural members of the support table 232 and the lifting pins 42 are omitted. The bottom wall 228 is provided with a central opening 254 of a predetermined size. A base plate 256 made of, for example, an aluminum alloy and having a diameter slightly greater than that of the opening 254 is placed on the upper surface of the bottom wall 228 and is fastened to the bottom wall 228 with bolts 258. The sealing member 260, such as an O ring, is held between the upper surface of the bottom wall 228 and the lower surface of the base plate 256 to seal hermetically the gap between the bottom wall 228 and the base plate 256.

The support post 230 is stood on the base plate 256. A holding member 262 is made of, for example, an aluminum alloy and has the shape of a ring having an inverted L-shaped cross section. The holding member 262 is put on the flange 252 so as to cover the flange 252 and is fastened to the base plate 256 with bolts 264 to hold the flange 252 fixedly between the holding member 262 and the base plate 256. A cushioning member 263 is held between the upper surface of the flange 252 and the joining surface of the holding member 262 to prevent the breakage of the flange 252. The cushioning member 263 is an annular carbon sheet of a thickness on the order of 0.5 mm that has a cushioning effect and does not produce particles. A sealing member 266, such as an O ring, is held between the upper surface of the base plate 256 and the lower surface of the flange 252 to seal hermetically the gap between the base plate 256 and the flange 252. The base plate 256 is provided with a big through holes 268. The power supply conductors 240 are extended outside through the through hole 268. The interior of the cylindrical support post 230 is at the atmospheric pressure. The support post 230 may be airtightly sealed.

The lower end covering member 280 made of transparent quartz glass covers the exposed surfaces of the holding member 262 and the base plate 256. The lower end covering member is a ring having an inverted L-shaped cross section. The thickness of the lower end covering member 280 is, for example, between about 2.75 and about 7.85 mm.

The diameter of the flange 252 is slightly smaller than the inside diameter of the support post covering member 278. Thus the support post 230 can be extracted upward from the support post covering member 278 after removing the base plate 256 and the holding member 262 by unfastening the bolts 258 and 264.

The surfaces of the cover assembly of transparent quartz glass, namely, the peripheral surface covering member 274, the lower surface covering member 276, the support post covering member 278 and the lower end covering member 280 are finished by a surface roughening process, such as a sandblasting process, and have fine irregularities. The anchoring effect of the fine irregularities makes unnecessary films deposited on those surfaces difficult to peel off.

The operation of the thermal processing system will be described.

A carrying arm, not shown, holds a new semiconductor wafer W, carries the semiconductor wafer W through the opened gate valve 18 and the opening 16 into the processing vessel 4, and places the semiconductor wafer W on the raised lifting pins 42. Then, the lifting pins 42 are lowered to seat the wafer W on the upper surface of the support table 232, more specifically, on the bottom surface of the central recess 284 formed in the upper surface of the upper surface covering member 272.

Subsequently, source gases are supplied at controlled flow rates, respectively, into the shower head 6. The sources gases are such as $TiCl_4$, $H_2$ and $NH_3$ when a Ti film is to be deposited. The source gases are $TiCl_4$ and $NH_3$ when a TiN film is to be deposited. The source gases are jetted through the gas jetting holes 10 into the processing space S. The vacuum pump, not shown, connected to the exhaust pipe 36 is operated continuously to suck atmospheres in the processing vessel 4 and the exhaust trapping space 22. The opening of the pressure regulating valve is regulated to maintain the processing space S at a predetermined process pressure. The wafer W is heated at temperatures between about 400 and about 600° C. Thus, a thin film of Ti or TiN is deposited on a surface of the wafer W.

It is possible that heavy metals slightly contained in the support table 232 are introduced into the processing vessel 4 by thermal diffusion during the film depositing process in which the support table 232 made of, for example, AlN is heated at high temperatures. According to the present invention, the support table 232 and the support post 238 are made of a heat-resistant, corrosion-resistant transparent quartz glass scarcely containing heavy metals and such. Therefore, heat can be efficiently transferred to the wafer W contamination, such as metal contamination can be prevented. Since the support table 232 is completely covered with the upper surface covering member 272 made of a material that will not cause contamination, such as metal contamination, such as SiC, the peripheral surface covering member 274 made of transparent quartz glass that is highly heat-resistant and will not cause contamination, such as metal contamination, and the lower surface covering member 276 made of transparent quartz glass, the diffusion of heavy metals into the processing vessel 4 can be prevented and the semiconductor wafer W can be prevented from being contaminated with heavy metals. The contamination, namely, metal contamination, can be sufficiently effectively prevented only by the upper surface covering member 272, the peripheral surface covering member 274 and the lower surface covering member 276.

Completely covering the support post 230 made of quartz glass with the support post covering member 278 made of, for example, transparent quartz glass enables the further improvement of the effect on preventing contamination, such as metal contamination. Covering the surface of the holding member 262 fixedly holding the lower end part of the support post 230 and the surface of the base plate 256 with the lower end covering member 280 made of transparent quartz glass can further improve the effect on preventing contamination, such as metal contamination.

Heat generated by the resistance heater 238 embedded in the support table 232 can be efficiently transferred to the wafer W to heat the wafer W efficiently because the upper surface covering member 272 interposed between the support table 232 and the wafer W is made of a material having a thermal conductivity higher than that of transparent quartz glass, such as SiC. Since the thermal conductivity of transparent quartz glass is higher than that of opaque quartz glass, heat can be transferred more efficiently when the support table 232 is made of transparent quartz glass than when the support table 232 is made of opaque quartz glass.

Since the upper surface of the support table 232 is covered with the opaque upper surface covering member 272 made of, for example, SiC, a temperature distribution on the resistance heater 238 is not directly reflected on the wafer W. Consequently, the uniformity of temperature distribution on the surface of the wafer W can be improved. Thus the upper surface covering member 272 has the function of a temperature equalizing plate.

As the film deposition process proceeds to deposit a desired film on the surface of the wafer W, unnecessary films are deposited inevitably on the exposed surfaces of the covering members 272, 274, 276, 278 and 280. Since the surfaces of the covering members 272, 274, 276, 278 and 280 are finished by a surface roughening process and fine irregularities are formed in those surfaces, the anchoring effect of those surfaces provided with the fine irregularities makes the unnecessary films deposited on those surfaces difficult to peel off. Therefore, the period of the maintenance work, such as a cleaning process, can be extended and the operating ratio of the thermal processing system can be increased accordingly.

Unnecessary films tend to deposit in patches on the lower surface of the lower surface covering member 276 covering the lower surface of the support table 232 during the film deposition process. In the conventional thermal processing system, the unnecessary films deposited in patches develop an uneven heat radiation distribution on the support table. In the thermal processing system of the present invention, unnecessary films deposited in patches do not develop an uneven heat radiation distribution because the annular, opaque back cover 282 is disposed under the support table 232 at a distance between about 1 and about 2 mm from the lower surface of the support table 232 so as to cover the lower surface of the support table 232 entirely. Therefore, the support table 232 can be heated so as to radiate heat in a uniform heat radiation distribution and is heated in a desired uniform temperature distribution, namely, uniform intrasurface temperature distribution, even if unnecessary films are deposited in patches on the lower surface of the lower surface covering member 276 and, consequently, the wafer W can be heated in a uniform intrasurface temperature distribution.

When the resistance heater 238 is divided into sections to heat zones of the support table 232 individually, the frequency of temperature tuning during the film deposition process can be reduced. Since quartz glass has a small coefficient of thermal expansion, the support table 232 will not break even if the zones of the support table 232 are heated at greatly different temperatures, respectively, and hence the zones of the support table 232 can be heated at desired temperatures, respectively. Since the opaque back cover 282 is capable of suppressing the loss of radiation heat, the thermal efficiency of the resistance heater 238 can be increased accordingly.

Although the lower surface covering member 276 and the opaque back cover 282 are placed under the lower surface of the support table 232 in this embodiment, the lower surface covering member 276 may be omitted and the opaque back cover 282 may be directly welded to the upper end of the support post covering member 278.

The thermal processing system has high maintainability because only the covering members 72, 74, 76, 78 and 80 need to be cleaned by a wet or dry cleaning process.

Since the support table 232 in this embodiment is made of transparent quartz glass having a coefficient of thermal expansion smaller than that of a ceramic material, such as AlN, used for making the conventional support table, the support table 232 has an improved heat resistance and can be heated at a high temperature higher than an upper limit temperature at which the conventional support table can be heated. Since the support table 232 is made of quartz having a small coefficient of thermal expansion, the support table 232 will not break even if magnitudes of power supplied to the zones are greatly different. Experiments showed that whereas a conventional support table made of AlN broke at about 700° C., the support table 232 of the present invention made of transparent quartz glass did not break when heated at about 720° C. In some cases, power of different magnitudes is used for heating an inner zone and an outer zone of the support table 232 to heat the support table 232 in an optimum temperature distribution. Experiments showed that the support table 232 did not break when input power ratio, namely, the ratio of the magnitude of input power for heating the inner zone to that of input power for heating the outer zone, was changed in the range of about 0.2 to about 1, and the support table 232 was heated at temperatures between 400 and 720° C. Additionally, the support table 232 did not break when the temperature of the support table 232 was raised up to 1200° C.

FIG. 9 is a graph showing data obtained by the experiments on the dependence of intrasurface temperature distribution on the support table 232 on process pressure for temperatures in the range of 400 to 720° C. The process pressure was varied in the range of $10^{-1}$ to 666 Pa. As obvious from FIG. 9, the uniformity of intrasurface temperature distribution is within ±0.7% and the mean uniformity of intrasurface temperature distribution is within ±0.5% for temperatures in the range of 400 to 720° C. In the conventional support table, the uniformity of intrasurface temperature distribution is on the order of ±1.2%. The experiments showed that the uniformity of intrasurface temperature distribution in the support table 232 is equal to or better than that in the conventional support table.

Since the resistance heater 238 is embedded in the support table 23 built by laminating the quartz glass plates, the power supply lines 240 emerge downward from the central part of the support table 232. The support table 232 constructed by superposing and welding together the top plate 300A, the middle plate 300B and the bottom plate 300C, which are made of quartz glass, can be completely separated from the processing vessel 4. Deposition of films on the upper surface of the support table 232, the lower surface of the upper surface covering member 272 and the side surface of the thermocouple holding hole 304 can be prevented by jetting out a purging gas from the upper surface of the support table 232.

Figure 10:
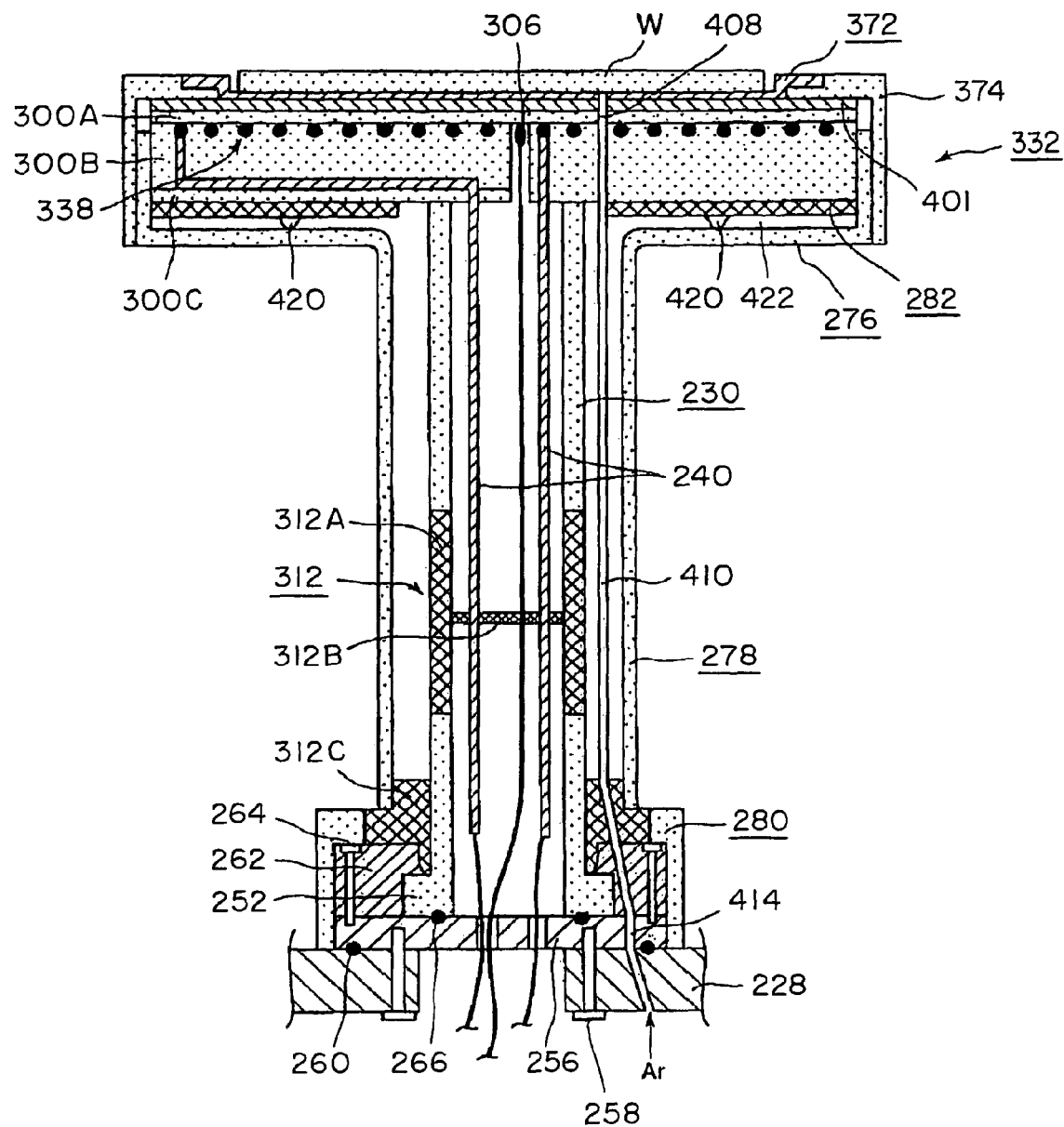
FIG. 10 is a sectional view of a support table structure in a modification of the support table structure in the second embodiment.

A support table structure in a modification of the support table structure in the second embodiment may be provided with a temperature equalizing plate 401 made of an opaque material, such as SiC, disposed between an upper surface covering member 372 and a top plate 300A as shown in FIG. 10. The temperature equalizing plate 401 contributes to uniformly heating the wafer W.

As shown in FIG. 10, gas passage 414 communicating with a gas supply pipe 410 may be formed outside a flange 252 and through an opaque third member 312C, a holding member 262, a base plate 256 and a bottom wall 228.

Projections 420 may be formed on the lower surface of an opaque back cover 282 to form a space 422 between the lower surface of the opaque back cover 282 and a lower surface covering member 276.

Figure 11:
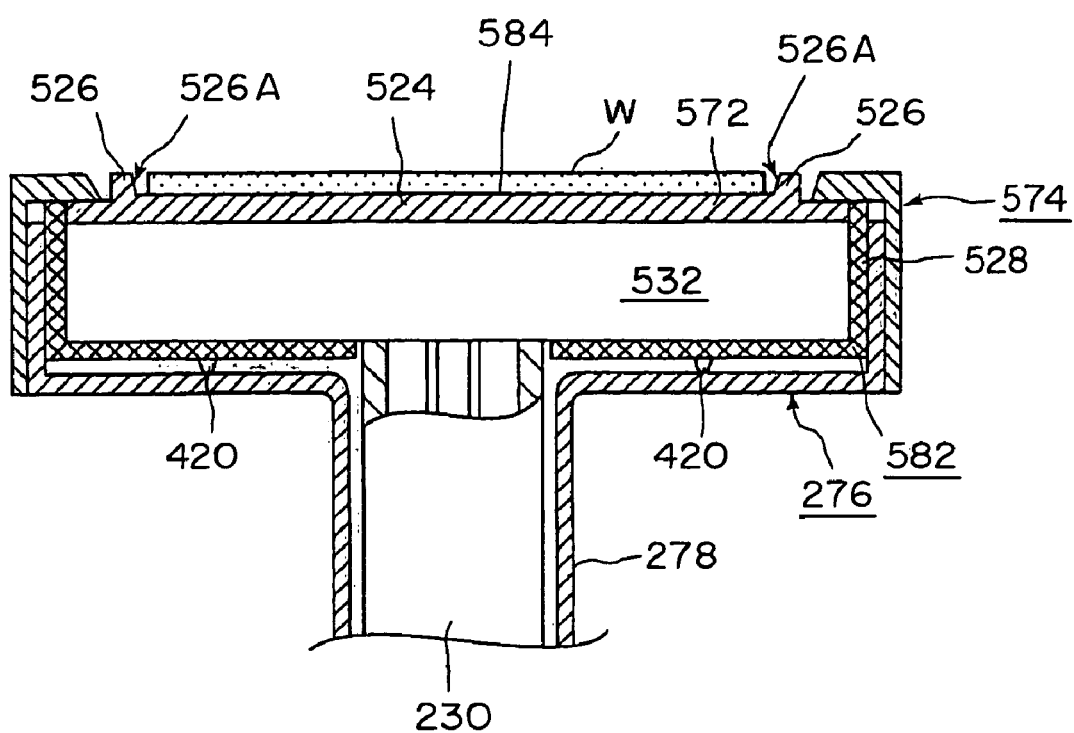
FIG. 11 is a sectional view of a support table structure in another modification of the support table structure in the second embodiment.
Figure 12:
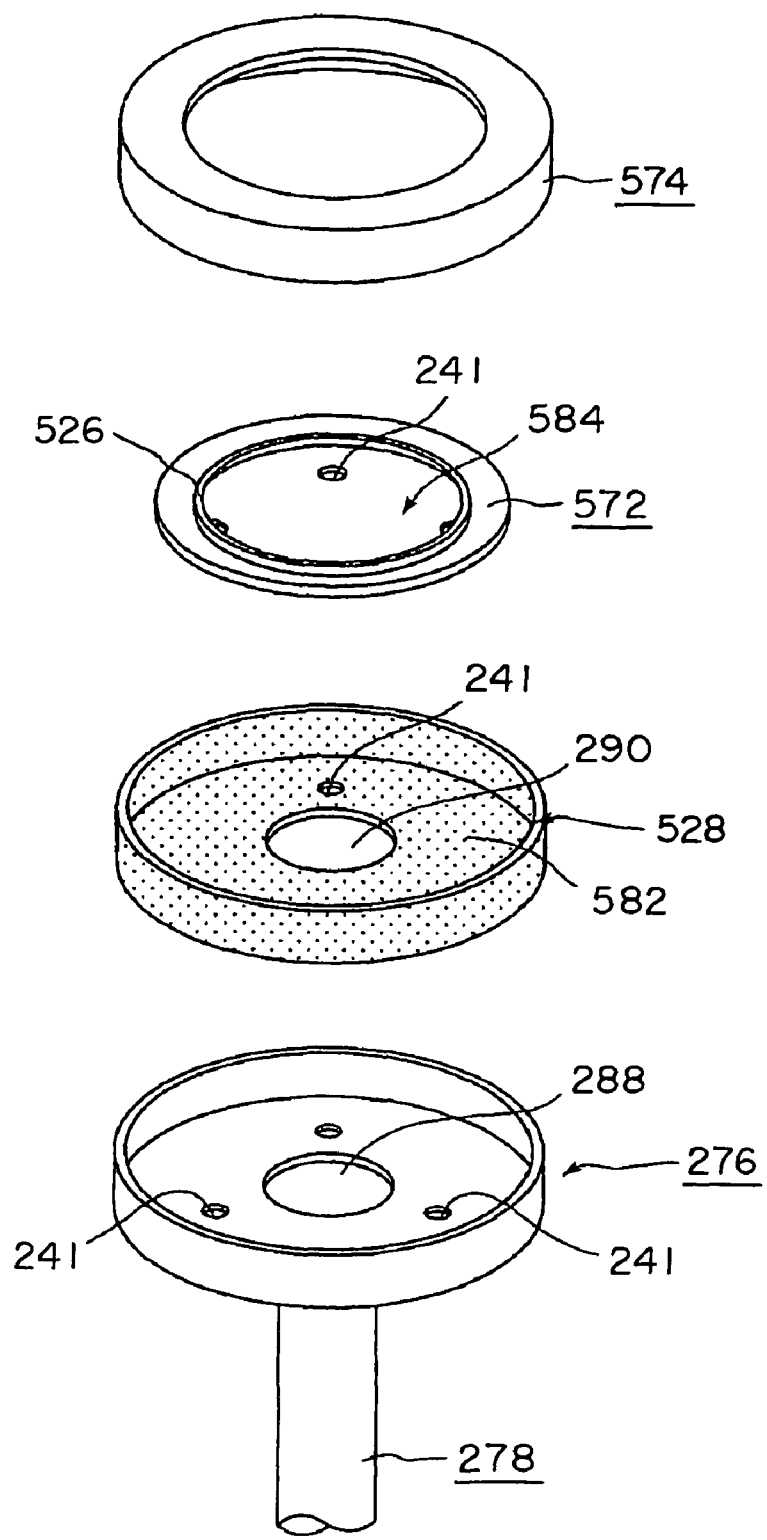
FIG. 12 is an exploded perspective view of the support table structure shown in FIG. 11.

As shown in FIGS. 11 and 12, in a support table structure in another modification of the support table structure in the second embodiment, the diameter of an upper surface covering member 572 may be substantially equal to that of a support table 532 to cover the upper surface of the support table 523 entirely with the upper surface covering member 572. The support table structure may be provided with a temperature equalizing plate corresponding to the temperature equalizing plate 401 mentioned in connection with FIG. 10.

The upper surface covering member 572 excluding a peripheral part thereof is raised slightly to form a raised part 524. A recess 584 is formed in the raised part 572. A wafer W is received in the recess 584. The inside surface of an annular ridge 526 is tapered downward to form a conical surface 526A. When a wafer W is put on the upper surface covering member 572, the conical surface 526A guides the wafer W to center the wafer W on the upper surface covering member 572. A peripheral surface covering member 574 is put on the upper surface covering member 572 such that the upper wall thereof is seated on a peripheral part of the upper surface covering member 572.

As shown in FIGS. 11 and 12, as a modification of the support table structure in the first and second embodiment, the side surface of the support table 532 is covered with an opaque quartz cover 528. Thermal efficiency can be improved by reflecting heat radiating from the support table 532 by the opaque quartz cover 528. The opaque quartz cover 528 shown in FIG. 11 is formed integrally with an opaque back cover 582 covering the lower surface of the support table 532 and an opaque side cover covering the side surface of the support table 532. The opaque side cover and the opaque back cover 582 may be separate members. The opaque quartz cover 528 covering the side surface of the support table 532 can be applied to the support table structures shown in FIGS. 2 and 4 for the same effect.

When the support table 532 is made of AlN, the upper surface covering member 572 is made of AlN or transparent or opaque quartz glass. When the support table 532 is made of transparent quartz glass as mentioned in connection with FIG. 10, the upper surface covering member 572 is made of AlN or opaque quartz glass.

Figure 13:
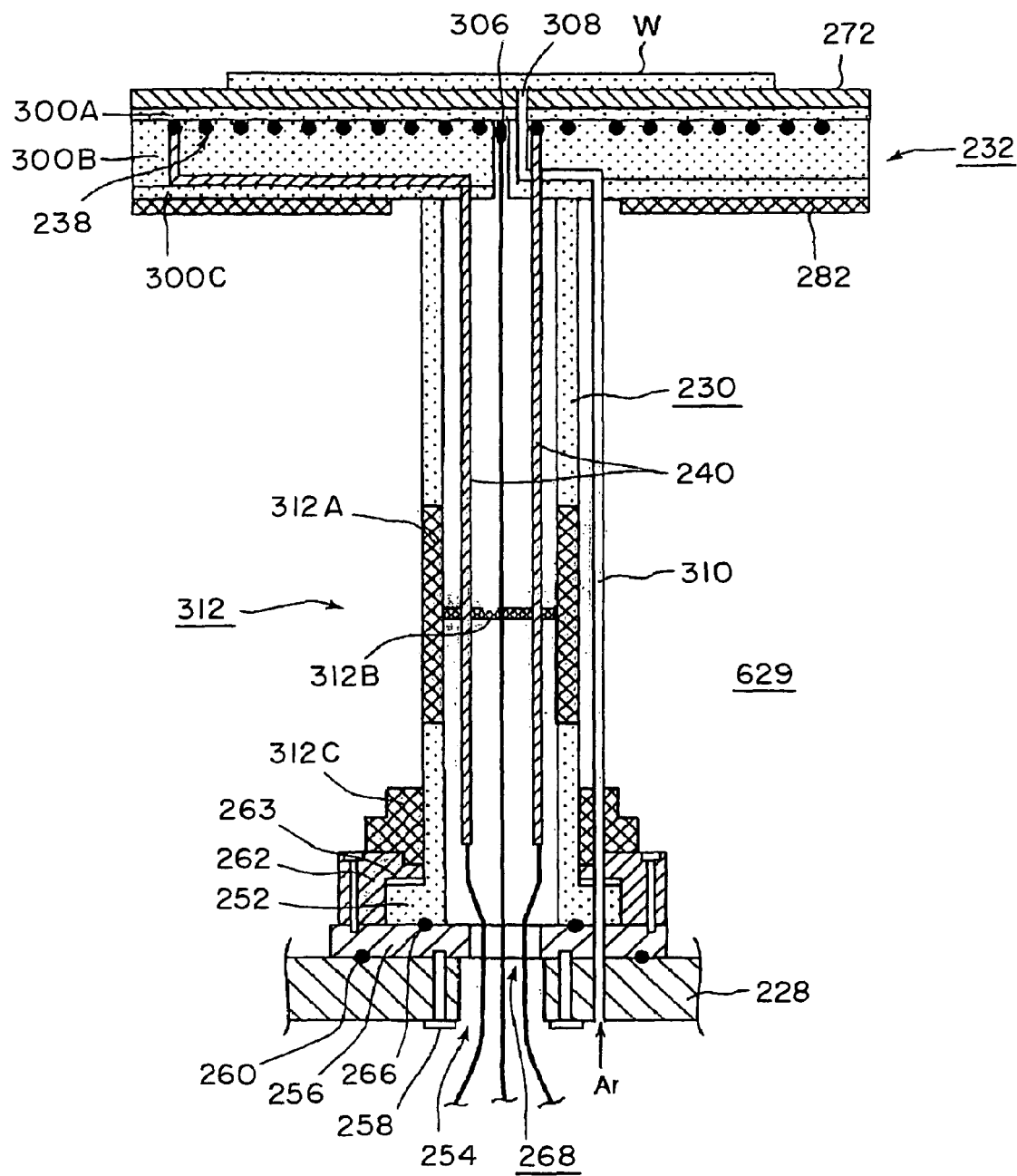
FIG. 13 is a sectional view of a support table structure in a third embodiment according to the present invention.

In the foregoing embodiments, the support table 232 and the support post 230 are covered with the covering members. A support table structure 629 in a third embodiment according to the present invention shown in FIG. 13 is not provided with any covering members. As shown in FIG. 13, the support table structure 629 does not have any members corresponding to the peripheral surface covering member 274, the lower surface covering member 276, the support post covering member 278 and the lower end covering member 280 shown in FIG. 4. An opaque back cover 282 is disposed in contact with the lower surface of a support table 232. Even if unnecessary films are deposited in patches on the lower surface of the opaque back cover 282, the opaque back cover 282 protects the support table 232 from the detrimental thermal effect based on the unnecessary films. An upper surface covering member 272 is placed on the upper surface of the support table 232 to improve the uniformity of intrasurface temperature distribution on a wafer.

In the support table structure 629 shown in FIG. 13, the exposed surfaces of the support table 232 and the support post 230 made of transparent quartz glass may be finished by a surface roughening process, such as a sandblasting process, as measures for preventing contamination with particles.

In the embodiments shown in FIGS. 4 and 13, the support table 232 and the support post 230 may be made of opaque quartz glass instead of transparent quartz glass. Only the bottom plate 300C may be made of opaque quartz glass and the opaque back cover 282 covering the lower surface of the support table 232 may be omitted.

Although the foregoing embodiments have been described on an assumption that the support table structure is used for a thermal CVD process, the present invention is applicable also to plasma CVD systems, etching systems, oxidizing and diffusing systems and sputtering systems.

Although the invention has been described as applied to processing a semiconductor wafer, it goes without saying that the present invention is applicable to processing LCD substrates, glass substrates and the like.

The term "transparent quartz glass" signifies quarts glass not perfectly transparent having a transmittance higher than a predetermined threshold transmittance as well as completely transparent quartz glass. The term "opaque quartz glass" signifies quartz glass having a transmittance lower than a predetermined threshold transmittance as well as completely opaque quartz glass. The predetermined threshold transmittance is determined on the basis of whether or not the thermal energy of light transmitted by an object has effect on the support table or the processing vessel.

The invention claimed is:

1. A support table structure comprising:
   a support table, for supporting a workpiece thereon to subject the workpiece to a predetermined thermal process in a processing vessel, provided with a heating means for heating the workpiece; and
   a support post standing on the bottom of the processing vessel and supporting the support table,
   characterized by a heat-resistant upper surface covering member, a heat-resistant side surface covering member and a heat-resistant lower surface covering member respectively covering an upper, a side and a lower surface of the support table, and a heat-resistant, opaque back cover disposed under the lower surface of the support table,
   an upper surface of a peripheral part of the upper surface covering member is contiguously covered with a part of the side surface covering member, the peripheral part of the upper surface covering member being connected with the side surface covering member so as to enclose the heating means,
   the lower surface covering member covers the lower surface of the opaque back cover, and
   the covering members excluding the upper surface covering member and the opaque back cover are made of transparent quartz glass, and the surfaces of the covering members made of transparent quartz glass are finished by a surface roughening process to prevent films deposited thereon from peeling off.

2. The support table structure according to claim 1, wherein the upper surface covering member has a diameter substantially equal to that of the support table, a raised part is formed on the upper surface of the upper surface covering member, and a recess for receiving the workpiece is formed in the raised part.

3. The support table structure according claim 1, wherein the side surface of the support table is covered with an opaque covering member made of opaque quartz glass.

4. The support table structure according to claim 1, wherein a space is formed between the opaque back cover and the lower surface covering member.

5. The support table structure according to claim 4, wherein projections project from the lower surface of the opaque back cover to define the space between the opaque back cover and the lower surface covering member.

6. The support table structure according to any one of claims 1, 4, and 5 wherein the opaque back cover is made of opaque quartz glass.

7. The support table structure according to claim 1, wherein the upper, the side and the lower surface covering member and the support post covered with a heat-resistant support post covering member constitute a cover assembly, the lower surface covering member and the support post covering member are formed integrally in a single member, and the cover assembly can be assembled and disassembled.

8. A support table structure comprising:
   a support table for supporting a workpiece thereon to subject the workpiece to a predetermined thermal process in a processing vessel; and
   a support post standing on the bottom of the processing vessel and supporting the support table;
   characterized in that the support table and the support post are made of quartz glass, a heating means is embedded in the support table, the support post has as a cylindrical shape, and power supply lines for supplying power to the heating means are extended outside the support table through a central part of the support table and are extended down through the cylindrical support post, and
   the support table is built by bonding together a top plate, a middle plate and a bottom plate, wiring grooves for holding the heating means are formed in either the lower surface of the top plate or the upper surface of the middle plate, and a wiring groove for holding the power supply lines connected to the heating means is formed in either the lower surface of the middle plate or the upper surface of the bottom plate.

9. The support table structure according to claim 8, wherein the upper surface of the support table is covered with an opaque temperature-equalizing plate.

10. The support table structure according to claim 8, wherein the support table is provided with a purging gas supply pore to supply a purging gas over the upper surface of the support table, and a gas supply quartz pipe is connected to the purging gas supply pore.

11. The support table structure according to claim 10, wherein the gas supply quartz pipe is extended outside the support post and has upper and lower ends welded to the support table and the support post, respectively.

12. The support table structure according to claim 8, wherein the quartz glass is transparent.

13. The support table structure according to claim 8, wherein a heat-resistant, opaque back cover is disposed under the lower surface of the support table.

14. The support table structure according to claim 8, wherein the upper, the side and the lower surface of the support table are covered with upper, side and lower surface covering members, respectively.

15. The thermal processing system according to claim 14, wherein the heating means for heating the support table is divided into inner and outer heating sections respectively corresponding to inner and outer zones in the support table.

16. The support table structure according claim 8, wherein the support post is stood up on a cushioning member to prevent the breakage of the support post.

17. The support table structure according to any one of claims 1 and 8, wherein the side surface of the support post is covered with a heat-resistant support post covering member.

18. The support table structure according to any one of claims 1 and 8, wherein a sealing member is disposed near a lower joining part of the support post, and the sealing member is shielded from heat radiated by the support table by an opaque shielding member.

19. The support table structure according to claim 18, wherein the support post is made of an opaque material, the support post is internally provided with an opaque member to protect the sealing member disposed near the lower joining part of the support post from heat radiated by the support table.

20. A thermal processing system comprising:
   a processing vessel capable of being evacuated;
   the support table structure according to any one of claims 1 and 8; and
   a gas supply system for supplying process gases into the processing vessel.

* * * * *